(12) United States Patent
Takeya et al.

(10) Patent No.: US 12,133,397 B2
(45) Date of Patent: Oct. 29, 2024

(54) ELECTRODE FOR SOURCE/DRAIN OF ORGANIC SEMICONDUCTOR DEVICE, ORGANIC SEMICONDUCTOR DEVICE USING SAME, AND METHOD FOR MANUFACTURING SAME

(71) Applicant: THE UNIVERSITY OF TOKYO, Tokyo (JP)

(72) Inventors: Junichi Takeya, Tokyo (JP); Shunichiro Watanabe, Tokyo (JP); Tatsuyuki Makita, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 312 days.

(21) Appl. No.: 17/753,409

(22) PCT Filed: Jun. 18, 2020

(86) PCT No.: PCT/JP2020/023900
§ 371 (c)(1),
(2) Date: Mar. 2, 2022

(87) PCT Pub. No.: WO2021/044705
PCT Pub. Date: Mar. 11, 2021

(65) Prior Publication Data
US 2022/0293874 A1    Sep. 15, 2022

(30) Foreign Application Priority Data

Sep. 3, 2019   (JP) ................................. 2019-160732

(51) Int. Cl.
*H01L 23/00*   (2006.01)
*H10K 10/46*   (2023.01)
(Continued)

(52) U.S. Cl.
CPC ........... *H10K 10/84* (2023.02); *H10K 10/471* (2023.02); *H10K 10/88* (2023.02); *H10K 71/60* (2023.02);
(Continued)

(58) Field of Classification Search
CPC ..... H10K 10/84; H10K 10/464; H10K 10/466
See application file for complete search history.

(56) References Cited

U.S. PATENT DOCUMENTS

| 7,981,814 B2 | 7/2011 | Schaper |
| 2005/0186699 A1 | 8/2005 | Kawase et al. |

(Continued)

FOREIGN PATENT DOCUMENTS

| JP | 2003258264 A | 9/2003 |
| JP | 2008047776 A | 2/2008 |

(Continued)

OTHER PUBLICATIONS

Lim et al, "Selectively Patterned Highly Conductive Poly (3, 4-ethylenedioxythiophene)-tosylate Electrodes for High Performance Organic Field-effect Transistors," Appl. Phys. Lett., vol. 95, No. 23, 2009, 233509, pp. 1-3 (Year: 2009)*

(Continued)

*Primary Examiner* — Anthony Ho
(74) *Attorney, Agent, or Firm* — MagStone Law, LLP; Enshan Hong

(57) ABSTRACT

The present disclosure provides fine electrodes in which an organic semiconductor does not easily change with time, and which can be applied to manufacturing of a practical integrated circuit of an organic semiconductor device. The present disclosure relates to electrodes for source/drain of an organic semiconductor device, comprising 10 or more sets of electrodes, wherein a channel length between the electrodes in each set is 200 μm or less, and the electrodes in (Continued)

each set have a surface with a surface roughness Rq of 2 nm or less.

14 Claims, 32 Drawing Sheets

(51) Int. Cl.
*H10K 10/84* (2023.01)
*H10K 10/88* (2023.01)
*H10K 71/60* (2023.01)
*H10K 71/80* (2023.01)
*H10K 85/10* (2023.01)
*H10K 85/60* (2023.01)

(52) U.S. Cl.
CPC ........... *H10K 71/611* (2023.02); *H10K 71/80* (2023.02); *H10K 85/141* (2023.02); *H10K 85/6576* (2023.02); *H10K 10/464* (2023.02); *H10K 10/466* (2023.02)

(56) References Cited

U.S. PATENT DOCUMENTS

| | | | | |
|---|---|---|---|---|
| 2011/0049489 | A1* | 3/2011 | Forrest | H10K 10/84 257/E51.013 |
| 2011/0117695 | A1 | 5/2011 | Cheng et al. | |
| 2011/0121273 | A1* | 5/2011 | Jo | B82Y 40/00 528/380 |
| 2013/0256640 | A1 | 10/2013 | Clough et al. | |
| 2016/0155969 | A1* | 6/2016 | Matsumoto | H10K 10/84 257/40 |
| 2017/0047558 | A1 | 2/2017 | Lee et al. | |
| 2017/0110665 | A1 | 4/2017 | Kanesaka et al. | |

FOREIGN PATENT DOCUMENTS

| | | |
|---|---|---|
| JP | 2009130327 A | 6/2009 |
| JP | 2014502047 A | 1/2014 |
| JP | 2014216477 A | 11/2014 |
| JP | 2017157752 A | 9/2017 |
| TW | 201621978 A | 6/2016 |
| WO | 2015163207 A1 | 10/2015 |
| WO | 2016031762 A1 | 3/2016 |

OTHER PUBLICATIONS

Lim et al., "Selectively Patterned Highly Conductive Poly (3, 4-ethylenedioxythiophene)-tosylate Electrodes for High Performance Organic Field-effect Transistors," Appl. Phys. Lett., vol. 95, No. 23, 2009, 233509, pp. 1-3.
Fujita et al., "Flexible Organic Field-Effect Transistors Fabricated by the Electrode-Peeling Transfer with an Assisit of Self-Assembled Monolayer," Appl.Phys. Lett., vol. 82, No. 24, 2003, pp. 4373-4375.
Liang et al., "A Flexible Future for Paper-Based Electronics," Proc. of SPIE, vol. 9836, 2016, 98361D, pp. 1-14.
Fian et al., AFM, Ellipsometry, XPS and TEM on Ultra-thin Oxide/Polymer Nanocomposite Layers in Organic Thin-Film Transistors, Analy. Bioanaly. Chem. vol. 390, No. 6, 2008, pp. 1455-1461.
Peng et al., Solution-Processed Monlayer Organic Crystals for High-Performance Field-Effect Transistors and Ultrasensitive Gas Sensors, Adv. Funct.Mater. vol. 27, No. 29, 2017, pp. 1-8.
European Application No. 20861639.1, Extended European Search Report mailed Aug. 31, 2023, 9 pages.
Loo et al., "Soft, conformable electrical contacts for organic semiconductors: High-resolution plastic circuits by lamination," PNAS, vol. 99, 2002, pp. 10252-10256.
Charles D. Schaper, "Patterned Transfer of Metallic Thin Film Nanostructures by Water-Soluble Polymer Templates," Nano Letters, vol. 3, 2003, pp. 1305-1309.
Linder et al., "Water-Soluble Sacrificial Layers for Surface Micromachining," Wiley-VCH Verlag, vol. 1, No. 7, 2005, pp. 730-736.
Jin et al., "Transfer printing of metal electrodes for high performance InSe photodetectors," Elsevier, vol. 436, 2019, pp. 47-51.
Tang et al., "Photolithography-compatible conformal electrodes for high-performance bottom-contact organic single-crystal transistorst," Journal of Materials Chemistry C, 2017, pp. 12699-12706.
Zhao et al., "Conformal transistor arrays based on solution-processed organic crystals," Scientific Reports, 2017, pp. 1-9.
Ito et al., "High-performance solution-processed organic transistors with electroless-plated electrodes," Elsevier, vol. 14, 2013, pp. 2144-2147.
Sakai et al., "All solution-processed organic single-crystal transistors with high mobility and low-voltage operation," Elsevier, vol. 22, 2015, pp. 1-4.
Zhang et al., "Top-Gate Organic Thin-Film Transistors Constructed by a General Lamination Approach," Wiley InterScience, 2010, pp. 3537-3541.
International Application No. PCT/JP2020/023900, International Search Report and Written Opinion mailed Sep. 15, 2020, 14 pages.

\* cited by examiner

C₉-DNBDT-NW

Transfer characteristics in saturation region $\mu_{sat} \sim 10 \text{ cm}^2 \text{ V}^{-1} \text{ s}^{-1}$ Transfer characteristics in linear region $\mu_{lin} \sim 10 \text{ cm}^2 \text{ V}^{-1} \text{ s}^{-1}$ $\mu_{sat} \sim 15.3\ cm^2/Vs$ $\mu_{lin} \sim 11.6\ cm2/Vs$ Transfer characteristics in saturation region $\mu_{sat} \sim 12 \text{ cm}^2 \text{ V}^{-1} \text{ s}^{-1}$ Transfer characteristics in linear region $\mu_{lin} \sim 13 \text{ cm}^2 \text{ V}^{-1} \text{ s}^{-1}$ Channel length L/channel width W = 100 μm/315 μm Transfer characteristics in saturation region
$V_D = -20$ V Mobility 12.7 cm$^2$/Vs 10 cm

ELECTRODE FOR SOURCE/DRAIN OF ORGANIC SEMICONDUCTOR DEVICE, ORGANIC SEMICONDUCTOR DEVICE USING SAME, AND METHOD FOR MANUFACTURING SAME

PRIORITY CLAIM

This is a U.S. national stage of application No. PCT/JP2020/023900, filed on Jun. 18, 2020. Priority is claimed on the following applications: Country: Japan, Application No.: 2019-160732, Filed: Sep. 3, 2019, the entire content of which is incorporated here by reference

FIELD

The present disclosure relates to electrodes for source/drain of an organic semiconductor device, an organic semiconductor device using the same, and a method for manufacturing the same.

BACKGROUND

In recent years, interest in organic semiconductors has been increasing. As features of organic semiconductors, unlike conventional inorganic semiconductors of amorphous silicon and polycrystalline silicon, it mentions that it is excellent in flexibility, that it can be inexpensively enlarged in area by roll to roll processing, etc., and applications of organic semiconductors as post-silicon semiconductors to electronic devices of the next generation type are examined.

In laminate devices, such as an organic field-effect transistor (OFET), electrodes, such as Au, are formed on an organic semiconductor layer by vacuum deposition, and photolithography is used to pattern the formed electrodes. However, it is known that device characteristics can be deteriorated due to thermal damage to the organic semiconductor layer at the time of deposition of the electrode, or damage to the organic semiconductor layer caused by a resist, an etchant, or the like at the time of the photolithography process.

As a method for forming an electrode on an organic semiconductor layer without damaging the organic semiconductor layer, a method in which an electrode pattern is formed on an elastomer having tackiness, and the elastomer on which the electrode pattern is formed is attached on the organic semiconductor layer is known, and is used in basic physical property evaluation (Non-Patent Literature 1).

CITATION LIST

Non-Patent Literature

[NPL 1] J. A. Rogers et al., Proc. Natl. Acad. Sci. USA 99, 10252 (2002)

SUMMARY

Technical Problem

However, with the method of Non-Patent Literature 1, it has been difficult to form fine electrodes on an elastomer that is susceptible to shrinkage, and the organic semiconductor is susceptible to damage in a relatively short period of time over time, making it difficult to apply the method to manufacturing a practical integrated circuit. The cause of the damage to the organic semiconductor in a relatively short period of time is unclear, but it is considered that an elastomer that easily expands and contracts depending on temperature or the like and easily changes with time is attached directly on the organic semiconductor film is affected, or that low-molecular siloxane contained in polydimethylsiloxane (PDMS) as an elastomer is affected.

Solution to Problem (1) Electrodes for source/drain of an organic semiconductor device, comprising:
  10 or more sets of electrodes,
  wherein a channel length between the electrodes in each set is 200 μm or less, and the electrodes in each set have a surface with a surface roughness Rq of 2 nm or less.
(2) The electrodes for source/drain according to (1), wherein the parallelism of the channel length between the electrodes in the each set is 1 degree or less.
(3) The electrodes for source/drain according to (1) or (2), further comprising a protective film, wherein the protective film is composed of an insulating polymer having a thickness of 1 μm or less and a glass transition point of 80° C. or more, attached to surfaces opposite to the surfaces of the electrodes in the each set by electrostatic force, and extending in at least a part of the channel in the each set.
(4) The electrodes for source/drain according to any one of (1) to (3), wherein the electrodes comprise plating.
(5) An organic semiconductor device comprising: a gate electrode, a gate insulating film, an organic semiconductor film, and the electrodes for source/drain according to any one of (1) to (4).
(6) The organic semiconductor device according to (5), wherein a surface roughness Rq of a surface of the organic semiconductor film in contact with the electrodes in each set is equal to or less than 2 nm.
(7) A method for manufacturing electrodes for source/drain of an organic semiconductor device, the method comprising:
  preparing a substrate having a surface with a surface roughness Rq of 2 nm or less,
  forming a release layer on the surface of the substrate,
  forming 10 or more sets of electrodes for source/drain having a channel length of 200 μm or less on the release layer,
  forming a protective film on the release layer and the electrodes,
  forming a handling film on the protective film,
  separating an interface between the release layer and each of the electrodes and the protective film to obtain an electrode film comprising the electrodes, the protective film, and the handling film, and
  removing the handling film.
(8) The method for manufacturing electrodes for source/drain of an organic semiconductor device according to (7), wherein the forming the release layer comprises:
  subjecting the surface of the substrate to UV ozone treatment to form a hydroxyl group on the surface of the substrate,
  subjecting the surface of the substrate on which the hydroxyl group has been formed to SAM treatment.
(9) The method for manufacturing electrodes for source/drain of an organic semiconductor device according to (7), wherein the forming the release layer comprises:
  forming a liquid-repellent polymer layer on the surface of the substrate, disposing a photomask or a metal mask on the substrate on which the liquid-repellent polymer layer has been formed, performing UV irradiation on the substrate from the side on which the photomask or the metal mask has been disposed to decompose the liquid-repellent polymer layer at the irradiated portion and form a hydroxyl group at the decomposed portion of the liquid-repellent polymer layer, and performing SAM treatment on the portion where the hydroxyl group has been formed, and wherein the forming 10 or more sets of electrodes for source/drain having a channel length of 200 μm or less comprises:

applying a conductive ink containing metal particles on the release layer; and performing electroless plating using the metal particles as a catalyst on the substrate on which the release layer coated with the conductive ink has been formed to form 10 or more sets of electrodes for source/drain provided with plating having the channel length of 200 μm or less.

(10) A method for manufacturing an organic semiconductor device, comprising:
preparing a substrate having a surface roughness Rq of 2 nm or less,
forming a release layer on the surface of the substrate,
forming 10 or more sets of electrodes for source/drain having a channel length of 200 μm or less on the release layer,
forming a protective film on the release layer and the electrodes,
forming a handling film on the protective film,
separating an interface between the release layer and the electrodes and the protective film to obtain an electrode film comprising the electrodes, the protective film, and the handling film, disposing the electrode film on the organic semiconductor film, and
removing the handling film.

(11) The method for manufacturing an organic semiconductor device according to (10), wherein
the forming the release layer comprises:
subjecting the surface of the substrate to UV ozone treatment to form a hydroxyl group on the surface of the substrate, and
performing SAM treatment on the surface of the substrate on which the hydroxyl group has been formed.

(12) The method for manufacturing an organic semiconductor device according to (10), wherein the forming the release layer comprises:
forming a liquid-repellent polymer layer on the surface of the substrate,
disposing a photomask or a metal mask on the substrate on which the liquid-repellent polymer layer has been formed,
performing UV irradiation on the substrate from the side on which the photomask or the metal mask has been disposed to decompose the liquid-repellent polymer layer at the irradiated portion and form a hydroxyl group at the decomposed portion of the liquid-repellent polymer layer, and performing SAM treatment on the portion where the hydroxyl group has been formed, and wherein the forming 10 or more sets of electrodes for source/drain having a channel length of 200 μm or less comprises:

applying a conductive ink containing metal particles on the release layer; and
performing electroless plating on the substrate on which the release layer coated with the conductive ink has been formed using the metal particles as a catalyst to form 10 or more sets of electrodes for source/drain provided with plating having the channel length of 200 μm or less.

Advantageous Effects of Invention

According to the present disclosure, it is possible to provide fine electrodes in which an organic semiconductor does not easily change with time, and which can be applied to manufacturing of a practical integrated circuit of an organic semiconductor device.

DESCRIPTION OF EMBODIMENTS

The present disclosure is directed to electrodes for source/drain of an organic semiconductor device, comprising: 10 or more sets of electrodes, wherein a channel length between the electrodes in each set is 200 µm or less, and the electrodes in each set have a surface having a surface roughness Rq of 2 nm or less.

Figure 1:
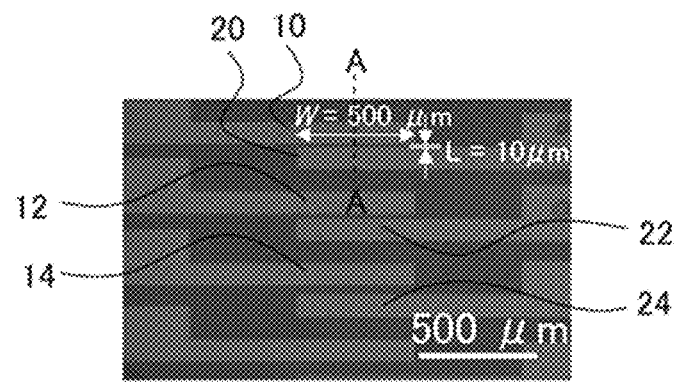
FIG. 1 is a microscopic photograph of electrodes for source/drain of the present disclosure viewed from the surface.
Figure 2:
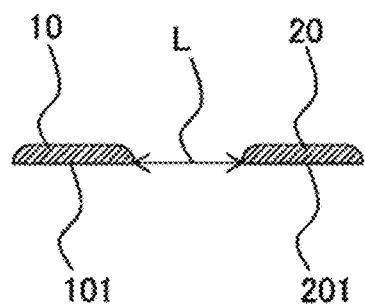
FIG. 2 is a cross-sectional schematic drawing of electrodes for source/drain of the present disclosure.
Figure 30:
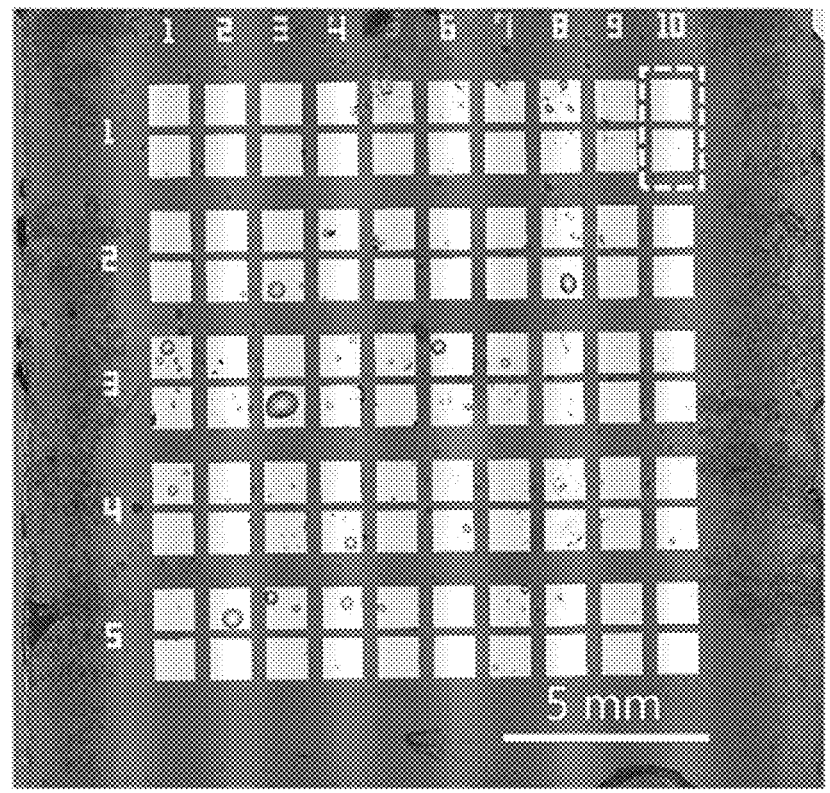
FIG. 30 is a top surface photograph of an example of electrodes for source/drain of the present disclosure.
Figure 31:
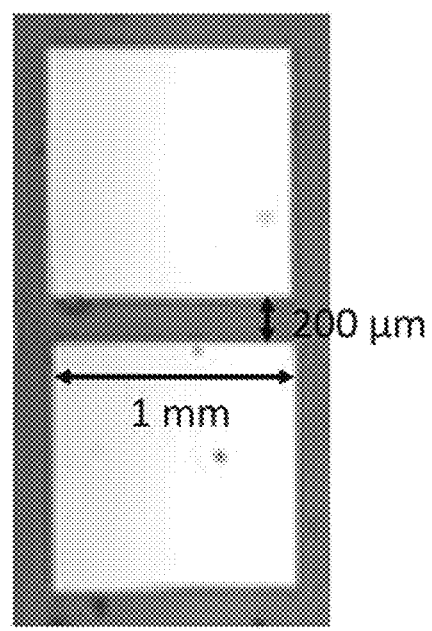
FIG. 31 is an enlarged photograph of a pair of electrodes for source/drain surrounded by a broken line in FIG. 30.

FIG. 30 shows a top surface photograph of 50 pairs of electrodes as an example of the electrodes for source/drain of the present disclosure. FIG. 31 shows an enlarged photograph of a pair of electrodes for source/drain surrounded by a broken line in FIG. 30. FIG. 1 shows an enlarged microscopic photograph of three sets of one example of the electrodes for source/drain of the present disclosure. FIG. 2 shows a cross-sectional schematic drawing of one set of electrodes for source/drain of the present disclosure. FIG. 2 is a cross-sectional schematic drawing of A-A of FIG. 1.

Figure 41:
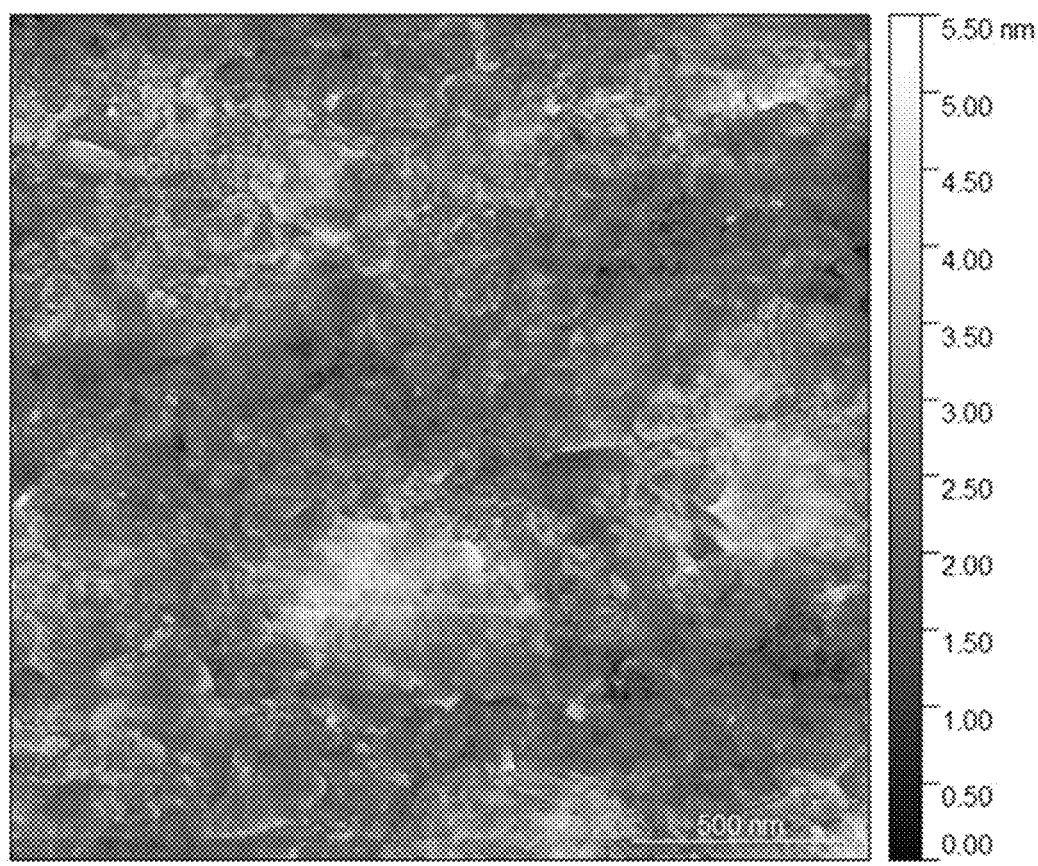
FIG. 41 is an example of an AFM measurement result of electrodes having a surface roughness Rq of 0.6 nm.

In FIG. 30, 50 sets of electrodes for source/drain are formed in a 1.5 cm square. The channel length of the electrodes of each set is 200 µm, the electrodes in each set have a surface with a surface roughness Rq of 2 nm or less, and the channel width of the electrodes of each set is 1000 µm. FIG. 41 shows an example of the AFM measurement results of the electrodes for source/drain of the present disclosure. FIG. 41 is an AFM measurement result of the Au electrode having a surface roughness Rq of 0.6 nm with a PMMA protective film and a PVA handling film.

The electrodes for source/drain of the present disclosure comprise 10 or more sets, preferably 50 or more sets, more preferably 1000 or more sets, even more preferably 10000 or more sets, and even more preferably 50000 or more sets of electrodes for source/drain.

In FIG. 1, the first electrode 10, 20 from the top has a channel length L of 10 µm, and a channel width W of 500 µm. The second electrodes 12 and 22 from the top have a channel length L of 20 µm and a channel width W of 500 µm. The third electrodes 14 and 24 from the top have a channel length L of 40 µm and a channel width W of 500 µm.

The channel length between the electrodes in each set of the electrodes for source/drain of the present disclosure is 200 µm or less, preferably 100 µm or less, more preferably 10 µm or less, even more preferably 1 µm or less, and even more preferably 0.5 µm or less. In the present application, the channel length is a channel length in each electrode set (one element). In each of the ten or more pairs of electrodes, the channel length may be different from each other as long as it is 200 µm or less. The lower limit value of the channel length is not particularly limited, and may be preferably about 0.05 µm, which is about the same as the lower limit value of a thickness of a protective film described below. Since the channel length of the electrodes for source/drain of the present disclosure is small, the organic semiconductor device comprising the electrodes for source/drain of the present disclosure can operate at a practical high frequency. The practical frequency is preferably 10 kHz or more, more preferably 100 kHz or more, even more preferably 1 MHz or more, and even more preferably 10 MHz or more. The channel length is an average value of values measured at three points in the channel width direction in each set (one element). The measurement positions of the three points are the positions of the center point and the two points on both sides of the center point, obtained by dividing the channel width into four equal parts.

The channel width is not particularly limited, and may be, for example, 100 µm to 10000 µm.

The electrodes for source/drain of the present disclosure have a surface having a surface roughness Rq of 2 nm or less. In FIG. 2, the surface 101 of the electrode 10 and the surface 201 of the electrode 20 have a surface roughness Rq of 2 nm or less. The surface roughness Rq of the electrode is preferably 1 nm or less, more preferably 0.5 nm or less. The lower limit value of the surface roughness Rq of the electrode is not particularly limited, and may be, for example, 0.1 nm.

In the electrodes for source/drain of the present disclosure, when used in an organic semiconductor device, a surface having a surface roughness Rq of 2 nm or less is in contact with the organic semiconductor film.

The surface roughness Rq of the surface of the organic semiconductor film in contact with the electrode is also small, preferably 2 nm or less. When the organic semiconductor film and the electrode having low surface roughness are disposed so as to be in contact with each other, the adhesion between the organic semiconductor film and the electrode can be improved, and the structure of the organic semiconductor film is not destroyed. Therefore, the organic semiconductor device comprising the electrodes for source/drain of the present disclosure can exhibit favorable characteristics. The surface roughness Rq of the organic semiconductor film is preferably 1 nm or less, more preferably 0.5 nm or less. The lower limit value of the surface roughness Rq of the organic semiconductor film is not particularly limited, and may be, for example, 0.1 nm. The surface roughness Rq of the electrode is the root-mean-square roughness of the value measured at three points using an atomic force microscope (AFM) on the surface of each pair of the electrodes (one element) in contact with the organic semiconductor film after separation from the release layer, and is the value of the square root of the value obtained by averaging the square of the deviation from the average line to the measurement curve. The measurement positions of the three points are the positions of the center point and the two points on both sides of the center point, obtained by dividing the longest line passing in the plane of the electrode into four equal portions. The longest line passing in the plane of the electrode is, for example, a diameter when the electrode is a circle, and a diagonal line when the electrode is rectangular.

In the electrodes for source/drain of the present disclosure, the parallelism of the channel length between the electrodes in each set is preferably 1 degree or less, more preferably 0.5 degrees or less, even more preferably 0.1 degrees or less, and even more preferably 0.01 degrees or less. The parallelism of the channel length is an angle formed by sides of opposing electrodes forming the channel length of each electrode set (one element). Since each set of electrodes is excellent in the parallelism of the channel length, the organic semiconductor device comprising the electrodes for source/drain of the present disclosure can exhibit characteristics as designed.

The method for measuring the angle (parallelism) formed by the sides of the opposing electrodes is performed as follows: SEM observation of the channel length is performed at a magnification as large as possible within a range including the entire channel length and channel width of each pair of electrodes (one element). Based on the SEM image obtained by SEM observation, the channel width is divided into four equal portions in the channel width direction with respect to the sides (two sides) of the opposing electrodes of each electrode set (one element), the positions of the sides of the five points including the both ends of the channel width are measured, and a straight line in which the sum of the squares of the distances from the measured five points is minimized is specified by the least squares method. The angle formed by the two specified straight lines is measured, and the parallelism is calculated.

The material of the electrode is not particularly limited as long as it is used in an organic semiconductor device, and preferably is Au, Ag, carbon, a conductive polymer, or a combination thereof, and more preferably is Au.

The thickness of the electrode is preferably 20 to 200 nm, more preferably 25 to 100 nm, and even more preferably 30 to 50 nm.

Preferably, the electrodes for source/drain of the present disclosure are composed of an insulating polymer having a glass transition point of 80° C. or more with a thickness of 1 μm or less, and further has a protective film attached to the surface of the electrode 10, 20 opposite to the surface 101, 201 by electrostatic force, and extending in at least a part of the channel.

Since the protective film is composed of an insulating polymer having a glass transition point of 80° C. or more and having no adhesiveness, it does not cause long-term damage to the organic semiconductor film, and the organic semiconductor does not easily change with time. In addition, by forming a thin film having a thickness of 1 μm or less, an adhesive force due to an electrostatic force can be exhibited between the protective film and the electrode, and between the protective film and the organic semiconductor film. In the present application, the change with time of the organic semiconductor is evaluated by measuring the value of the mobility of the semiconductor device comprising the organic semiconductor for a predetermined period, preferably 4 weeks or more, more preferably 8 weeks or more.

While not wishing to be bound by theory, as described above, it is considered that when an elastomer having a tack property and a low glass transition point is used, the organic semiconductor film is easily damaged in a relatively short period of time, but since an insulating polymer having a glass transition point of 80° C. or more having a thickness of 1 μm or less adheres to the organic semiconductor film by electrostatic force, the long-term stability of the organic semiconductor film is high, and the organic semiconductor is difficult to change with time.

Figure 3:
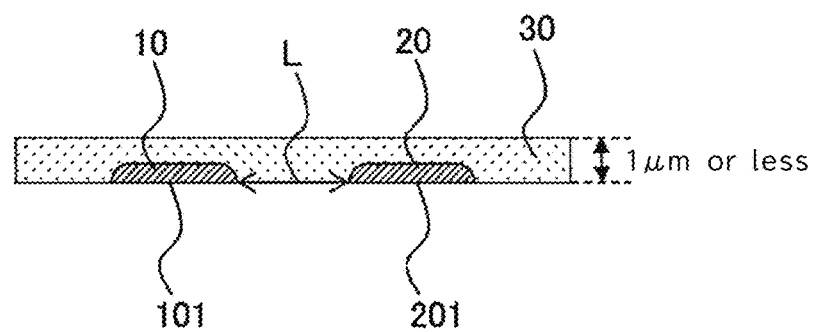
FIG. 3 is a cross-sectional schematic drawing of electrodes for source/drain of the present disclosure having a protective film.

FIG. 3 shows a cross-sectional schematic drawing of the electrodes 10 and 20 for source/drain of the present disclosure having the protective film 30. The thickness of the protective film 30 has a thickness of preferably 1 μm or less, more preferably less than 1 μm, and even more preferably 0.5 μm or less. The lower limit value of the thickness of the protective film is not particularly limited, but is 0.05 μm from the viewpoint of stably forming the insulating film.

The glass transition point of the protective film 30 is 80° C. or more, preferably 90° C. or more, more preferably 100° C. or more. Since the insulating polymer having the glass transition point in the range described above has the glass transition point sufficiently higher than the room temperature, when disposed in contact with the organic semiconductor film, the organic semiconductor film is unlikely to be deteriorated, and the organic semiconductor is unlikely to change with time.

Figure 4:
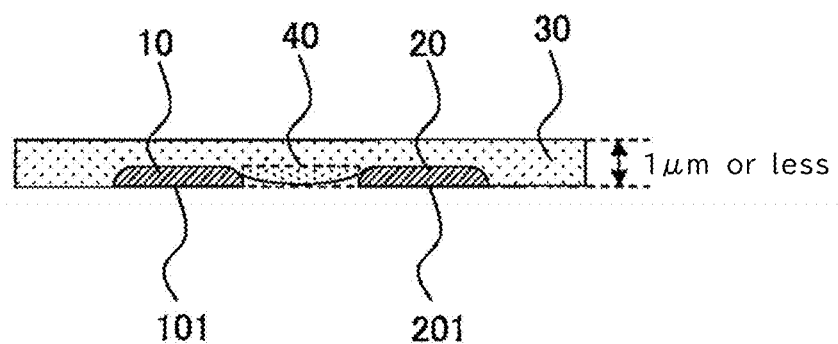
FIG. 4 is a cross-sectional schematic drawing of electrodes for source/drain of the present disclosure having a protective film.

The protective film 30 adheres to the surfaces of the electrodes 10 and 20 opposite to the surfaces 101 and 201 by electrostatic force. As shown in FIG. 4, the protective film 30 may extend in at least a part of the channel 40 which is a region indicated by the broken line between the electrodes 10 and 20. Preferably, the protective film 30 extends in substantially all regions of the channel 40 as shown in FIG. 3.

The protective film 30 does not substantially have an adhesive force, and substantially adheres to the electrodes 10 and 20 by an electrostatic force. The protective film 30 facilitates the handling of the electrode after the electrode is formed, prevents the electrode from being destroyed at the time of removing the handling film described later, and in the organic semiconductor device using the electrodes of the present disclosure, can suppress the electrode from peeling off from the organic semiconductor film.

The material of the protective film 30 is preferably a fluorine-based polymer, such as polymethyl methacrylate (PMMA) having a glass transition point of about 100° C., CYTOP (registered trademark) having a glass transition point of about 108° C., or the like, polyparaxylylene (parylene (registered trademark)) having a glass transition point of about 109° C., or polyadamantyl methacrylate (PADMA) having a glass transition point of 200° C. or more.

The electrodes for source/drain of the present disclosure preferably comprise plating. By having the electrodes for source/drain with plating, the work function of the electrodes can be controlled, and carrier injection from the electrode to the organic semiconductor can be improved.

The plating is preferably Au plating, Ag plating, Pt plating, or Cu plating, more preferably Au plating. By providing the electrodes for source/drain with the preferable metal plating, it is possible to form an electrode having a high work function advantageous for carrier injection into an organic semiconductor.

The work function is photoelectron yield spectroscopy (PYS) and is measured by the following formula:

$$Y^{1/2} \propto h\nu - W_F \quad \text{[Formula 1]}$$

wherein Y is the photoelectron yield, h is the Planck constant, v is the frequency of the photons, and $W_F$ is the work function. When a substance is irradiated with light having energy equal to or greater than a certain level, electrons are emitted from the substance by the photoelectric effect. The energy at which the electron starts to be emitted corresponds to the work function. In PYS, measurement is performed by measuring emitted electrons while changing the energy of irradiated light. When the photoelectron yield representing the ratio of the number of emitted electrons to the number of irradiated photons is Y, the energy of the irradiated light is hv, and the work function of a substance to be measured is $W_F$, the relationship of the following formula:

$$Y \propto (h\nu - W_F)^n \quad \text{[Formula 2]}$$

is established. The n is a value determined by the type of the material, and in the case of a metal, n=2. $Y^{1/2}$ is plotted with respect to hv, and linear approximations are performed in each of regions before and after a portion which is considered to be $W_F$. $W_F$ is obtained by obtaining an intersection point of two straight lines obtained thereby.

Figure 5:
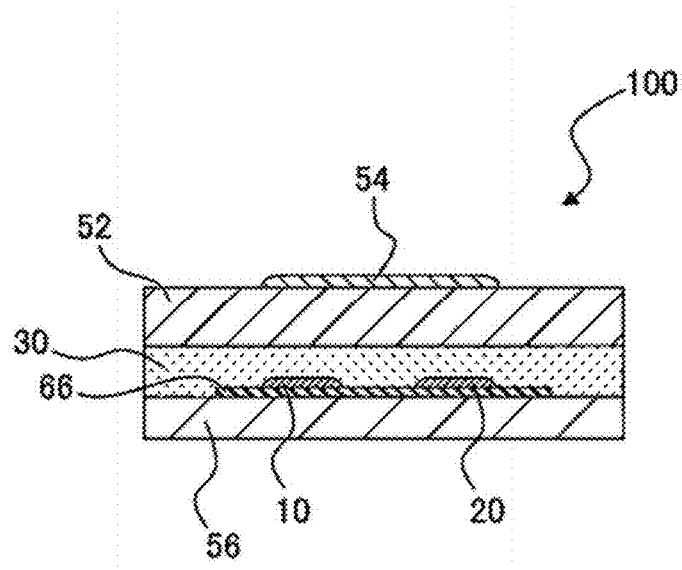
FIG. 5 is a cross-sectional schematic drawing of an organic semiconductor device comprising a gate electrode, a gate insulating film, an organic semiconductor film, and electrodes for source/drain of the present disclosure.
Figure 6:
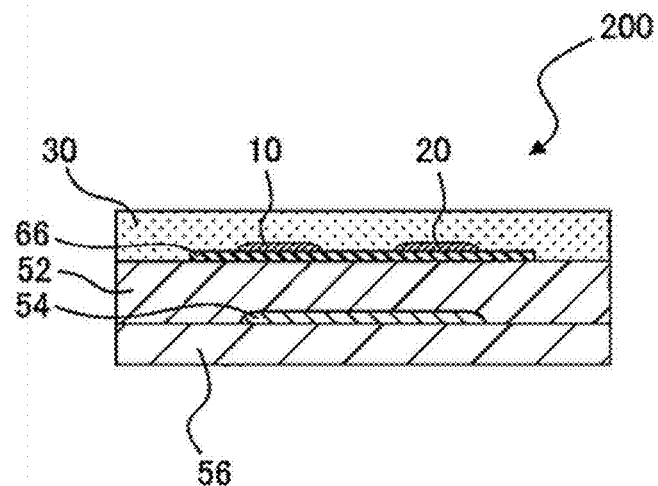
FIG. 6 is a cross-sectional schematic drawing of an organic semiconductor device comprising a gate electrode, a gate insulating film, an organic semiconductor film, and electrodes for source/drain of the present disclosure.

FIG. 5 and FIG. 6 show cross-sectional schematic diagrams of the organic semiconductor devices 100 and 200 of the present disclosure comprising the gate electrode 54, the gate insulating film 52, the organic semiconductor film 66, and the electrodes 10 and 20 for source/drain. FIG. 5 is a cross-sectional schematic drawing of the top gate/top contact structure, and FIG. 6 is a cross-sectional schematic drawing of the bottom gate/top contact structure.

In the organic semiconductor devices 100 and 200 of FIGS. 5 and 6, the electrodes 10 and 20 are included as source/drain electrodes.

The gate electrode 54 may be composed of a material of a gate electrode conventionally used, and may be, for example, doped-Si. The doped-Si can be one conventionally used as a gate electrode having a sufficiently low resistance value.

The gate insulating film 52 may also be composed of a material of a gate insulating film conventionally used.

In the top gate/top contact structure, the gate insulating film 52 may be integrally formed with the protective film 30 composed of an insulating polymer.

The underlayer 56 can also be a layer including a substrate, a smoothed layer, and a surface-modified layer, which are conventionally used. Examples of the underlayer 56 include glass, a glass substrate coated with a film, such as parylene (registered trademark) or trimethoxy(2-phenylethyl)silane (β-PTS), a plastic substrate, such as polyethylene terephthalate (PET) or polyethylene naphthalate (PEN), a plastic substrate, such as PET or PEN whose surface is coated with a film, such as parylene (registered trademark), a substrate on which a device, such as a transistor is fabricated on the above substrate, or a substrate in which an interlayer insulating film, such as parylene (registered trademark) or alumina is deposited on the above device.

When the electrodes for source/drain of the present disclosure having the protective film 30 are prepared, the protective film 30 may be used as an insulating thin film as it is in the organic semiconductor devices 100 and 200, or the protective film 30 may be once dissolved to newly form the protective film 30, or the protective film 30 may be newly formed integrally with the gate insulating film 52.

In the organic semiconductor device, preferably, the surface roughness Rq of the surface of the organic semiconductor film in contact with the electrodes is 2 nm or less. When the organic semiconductor film and the electrodes having low surface roughness are disposed so as to be in contact with each other, the adhesion between the organic semiconductor film and the electrodes can be improved, and the contact resistance can be reduced. The surface roughness Rq of the organic semiconductor film is the root-mean-square roughness of the value measured at three points on the surface of the organic semiconductor film using an atomic force microscope (AFM), and is the value of the square root of the value obtained by averaging the square of the deviation from the average line to the measurement curve. The measurement positions of the three points are the positions of the center point and the two points on both sides of the center point, obtained by dividing the longest line passing in the plane of the organic semiconductor film into four equal portions. The longest line passing in the plane of the organic semiconductor film is, for example, a diameter when the organic semiconductor film is a circle, and a diagonal line when the organic semiconductor film is a quadrangle.

The contact resistance $R_C \cdot W$ of the organic semiconductor device of the present disclosure is preferably 200 Ω·cm or less, more preferably 175 Ω·cm or less, even more preferably 150 Ω·cm or less, and even more preferably 125 Ω·cm or less. The $R_C$ is the contact resistance, and the W is the channel width.

The contact resistance of the organic semiconductor device is evaluated using the Transmission Line Method (TLM) method. The TLM method is a method of plotting the resistance $R_{total} \cdot W$ against the channel length L for an organic semiconductor device having a plurality of the channel lengths to indirectly estimate $R_C \cdot W$ from the y-intercept of the regressive line, based on the following formula:

$$R_{total} = \frac{L}{\mu_{int} W C_i (V_G - V_{th})} + R_C \quad \text{[Formula 3]}$$

wherein $R_{total}$ is the resistance of the organic semiconductor device, $R_C$ is the contact resistance, L is the channel length, $\mu_{int}$ is the intrinsic mobility of the organic semiconductor device excluding the effect of the contact resistance, W is the channel width, $C_i$ is the capacitance per unit area, $V_G$ is the gate voltage, and $V_t h$ is the threshold voltage. The $R_{total} \cdot W$ is obtained by dividing the drain voltage VD by the drain current $I_{D,lin}$ in the transfer characteristics of the linear domain.

The organic semiconductor device comprising the electrodes for source/drain of the present disclosure can be an organic EL (electroluminescence) element, an organic solar cell element, an organic photoelectric conversion element, an organic transistor element, an organic field effect transistor (OFET) element, or the like.

The present disclosure is also directed to a method for manufacturing electrodes for source/drain of an organic semiconductor device, the method comprising: preparing a substrate having a surface with a surface roughness Rq of 2 nm or less, forming a release layer on the surface of the substrate, forming 10 or more sets of electrodes for source/drain having a channel length of 200 µm or less on the release layer, forming a protective film on the release layer and the electrodes, forming a handling film on the protective film, separating an interface between the release layer and each of the electrodes and the protective film to obtain an electrode film comprising the electrodes, the protective film, and the handling film, and removing the handling film.

According to the method of the present disclosure, it is possible to obtain electrodes for source/drain of an organic semiconductor device, comprising 10 or more sets of electrodes, wherein a channel length between the electrodes in each set is 200 µm or less, and the electrodes in each set have a surface with a surface roughness Rq of 2 nm or less.

In the method of the present disclosure, a substrate having a surface roughness Rq of 2 nm or less is prepared. The surface roughness Rq of the substrate is preferably 1 nm or less, more preferably 0.5 nm or less. The lower limit value of the surface roughness Rq of the substrate is not particularly limited, and may be, for example, 0.1 nm. According to the method of the present disclosure, it is possible to obtain electrodes for source/drain having substantially the same surface roughness as the surface roughness Rq of the substrate. The surface roughness Rq of the substrate is the root-mean-square roughness of the value measured at three points on the surface of the substrate using an atomic force microscope (AFM), and is the value of the square root of the value obtained by averaging the square of the deviation from the average line to the measurement curve. The measurement positions of the three points are the positions of the center point and the two points on both sides of the center point, obtained by dividing the longest line passing in the plane of the substrate into four equal portions. The longest line passing in the plane of the substrate is, for example, a diameter when the substrate is a circle, and a diagonal line when the substrate is rectangular.

The substrate having the above surface roughness Rq is preferably a glass substrate or a silicon substrate, and is, for example, EAGLE XG (registered trademark) manufactured by Corning. The substrate having the surface roughness Rq may be prepared by polishing a substrate, such as a glass substrate or a silicon substrate.

In the method of the present disclosure, the release layer is formed on the surface of the prepared substrate.

An embodiment for forming the release layer preferably comprises: forming a hydroxyl group on the surface of the prepared substrate by subjecting the surface of the substrate to UV-ozone (UV/$O_3$), and subjecting the surface of the substrate on which the hydroxyl group is formed to self-assembled monolayer (SAM) treatment.

By performing UV ozone treatment, an organic substance on the surface of the substrate is oxidized and removed, so that a hydroxyl group can be formed on the surface of the oxide film. In UV-ozone treatment, for example, oxygen ($O_2$) in the air can absorb ultraviolet rays having a wavelength of about 185 nm to generate ozone ($O_3$), the generated ozone ($O_3$) can absorb ultraviolet rays having a wavelength of about 254 nm to generate $O_2$ and active oxygen, and the active oxygen can oxidize and decompose organic substance on the surface of the substrate to form a hydroxyl group on the surface of the oxide film.

Figure 7:
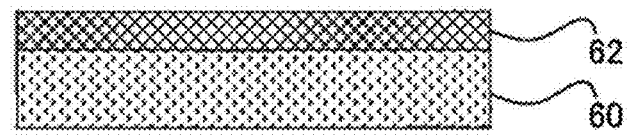
FIG. 7 is a cross-sectional schematic drawing of a substrate on which a release layer is formed.

By performing SAM treatment on the surface of the substrate on which the hydroxyl group is formed, a release layer can be formed on the surface of the substrate. FIG. 7 shows a cross-sectional schematic drawing of the substrate 60 on which the release layer 62 is formed by UV ozone treatment and SAM treatment. The SAM treatment is performed in order to adjust the surface energy.

The release layer 62 is a film for separating electrodes and a protective film formed in a later step from the substrate 60. The release layer 62 remains on the substrate 60 side, and the electrodes and the protective film are separated. The release layer 62 is preferably a self-assembled monolayer. The adhesion force between the electrode and the self-assembled monolayer is weaker than the adhesion force between the electrode and the protective film, and the adhesion force between the protective film and the self-assembled monolayer is weaker than the adhesion force between the protective film and the handling film.

The self-assembled monolayer preferably has a linear alkyl group or fluoroalkyl group, and the terminal group is an alkyl group, a fluoroalkyl group, a phenyl group, or a fluorophenyl group. Since such a self-assembled monolayer is a hydrophobic film having a contact angle of preferably 80 degrees or more, more preferably 90 degrees or more, and even more preferably 95 degrees or more, the electrodes and the protective film formed on the self-assembled monolayer in a later step can be easily separated.

In the linear alkyl group $(CH)_n$, n is not particularly limited, and preferably is 8 to 18. Similarly, in the linear fluoroalkyl group $(CF)_n$, n is not particularly limited, and is preferably 1 to 10.

The self-assembled monolayer is, for example, decyltrimethoxysilane (DTS), triethoxy-1H, 1H, 2H, 2H-heptadecafluorodecylsilane (F-SAM), or trimethoxy(2-phenylethyl)silane (β-PTS). Since DTS has a contact angle of about 101 degrees, F-SAM has a contact angle of about 110 degrees, and β-PTS has a contact angle of about 80 degrees, the electrodes and the protective film formed on the self-assembled monolayer in a later step can be more easily separated from the substrate.

The SAM treatment can be performed by a vapor phase method or a liquid phase method.

The vapor phase method is a method in which the substrate on which the hydroxyl group is formed is exposed to a saturated vapor of SAM molecules. Thereby, the SAM molecules and the hydroxyl group are dehydrated and condensed, and a self-assembled monolayer can be formed on the surface of the substrate.

The exposure of the substrate to the saturated vapor of the SAM molecules can be performed, for example, by disposing the SAM solution and the substrate in a sealed container, forming a saturated vapor atmosphere of the SAM molecules by heating, and standing the substrate in the saturated vapor atmosphere of the SAM molecules. The standing time can be about 2 to 5 hours. The heating temperature can be about 120 to 150° C.

After the substrate is exposed to the saturated vapor of SAM molecules, the substrate is cleaned. In the case of DTS, the substrate is washed with toluene, and then with 2-propanol. For F-SAM: the substrate is washed with 2-propanol. In the case of β-PTS, the substrate is washed with toluene, and then with 2-propanol.

The liquid phase method is a method in which the substrate on which the hydroxyl group is formed is immersed in a solution in which SAM molecules are dissolved. This method can also form a self-assembled monolayer on the surface of the substrate.

Figure 8:
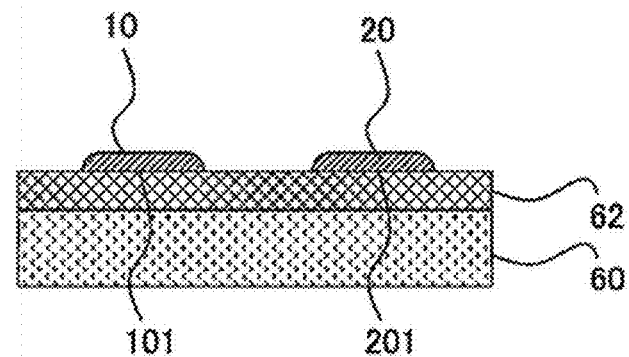
FIG. 8 is a cross-sectional schematic drawing of a substrate on which electrodes are formed on a release layer.

In the method of the present disclosure, electrodes are formed on the release layer formed on the substrate. FIG. 8 shows a cross-sectional schematic drawing of the substrate 60 on which the electrodes 10 and 20 are formed on the release layer 62.

The method for forming the electrodes is not particularly limited, and a film or electrodes composed of an electrode material can be formed using a vacuum process or a solution process.

For example, electrodes can be formed on the release layer by a printing method, such as gravure offset printing, screen printing, or ink jet printing. Alternatively, a film of the electrode material can be coated on the release layer by vacuum deposition, spin coating, dip coating, roll coating, spray coating, flow coating, blade coating, push coating, or the like, and the formed film of the electrode material can be patterned using photolithography to form electrodes.

The method for forming the electrodes may be selected depending on the electrode material. When the electrode material is Au, the electrodes are preferably formed by vacuum deposition and patterning using photolithography.

When the electrode is Ag, it is preferable to form the electrodes on the release layer by a printing method, such as gravure offset printing, screen printing, or ink jet printing.

When the electrode is carbon, it is preferable to form the electrodes on the release layer by spray coating, blade coating, or the like.

When the electrode is a conductive polymer, it is preferable to form the electrodes on the release layer by spin coating, push coating, or the like.

Other embodiments for forming the release layer preferably comprise: forming a liquid-repellent polymer layer on the surface of the substrate; disposing a photomask or a metal mask on the substrate having the liquid-repellent polymer layer formed thereon; performing UV (ultraviolet light) irradiation on the substrate from the side on which the photomask or the metal mask is disposed to decompose the liquid-repellent polymer layer at the irradiated portion and form a hydroxyl group at the portion in which the liquid-repellent polymer layer is decomposed, and performing SAM treatment on the portion in which the hydroxyl group is formed.

In the present embodiment comprising forming the liquid-repellent polymer layer, forming the hydroxyl group at a portion in which the liquid-repellent polymer layer is decomposed, and performing SAM treatment at a portion in which the hydroxyl group is formed, the forming 10 or more sets of electrodes for source/drain having a channel length of 200 μm or less comprises applying a conductive ink containing metal particles on the release layer, and performing electroless plating using the metal particles as a catalyst on the substrate on which the release layer coated with the conductive ink is formed to form 10 or more sets of electrodes for source/drain provided with plating having a channel length of 200 μm or less.

In the present embodiment comprising forming the liquid-repellent polymer layer, forming the hydroxyl group at a portion in which the liquid-repellent polymer layer is decomposed, and performing SAM treatment at a portion in which the hydroxyl group is formed, the patterning of the electrodes is performed using the difference in wettability of the conductive ink between the liquid-repellent polymer layer and the portion in which the SAM treatment is performed.

The liquid-repellent polymer layer can be formed on the surface of the substrate by a coating method. As the coating method, a method conventionally used can be used, and for example, an edge casting method, a continuous edge casting method, a drop casting method, a spin coating method, a printing method (ink jet method or gravure printing method), a dispenser method, a spray method, a dip coating method, a die coater method, a roll coater method, a bar coater method, a blade coating method, or the like can be used.

The thickness of the liquid-repellent polymer layer is preferably 1 to 50 nm, more preferably 2 to 30 nm, even more preferably 3 to 20 nm, and even more preferably 5 to 15 nm. By having the preferable thickness of the liquid-repellent polymer layer, the surface roughness of the electrode to be formed can be reduced.

The material of the liquid-repellent polymer layer is preferably a fluorine-based polymer, such as CYTOP (registered trademark), polytrifluoroethylene (PTFE), and perfluoroalkoxyalkane (PFA). Before forming the liquid-repellent polymer layer on the surface of the substrate, UV treatment may be performed on the surface of the substrate.

The photomask or the metal mask disposed on the substrate on which the liquid-repellent polymer layer is formed is not particularly limited as long as it can block UV light, and can be made of chromium, for example.

UV irradiation is performed on the substrate on which the liquid-repellent polymer layer is formed from the side on which the photomask or the metal mask is disposed, the liquid-repellent polymer layer at the irradiated portion is decomposed, and a hydroxyl group is formed at the portion in which the liquid-repellent polymer layer is decomposed. By forming the hydroxyl group, the surface becomes hydrophilic.

The liquid-repellent polymer layer is decomposed by UV irradiation, but not all of the liquid-repellent polymer layer may be decomposed and a part may remain. The hydroxyl group can be formed on the substrate which is exposed by decomposition of the liquid-repellent polymer layer, on the remaining liquid-repellent polymer layer, or on both the exposed substrate and the remaining liquid-repellent polymer layer.

The UV light is preferably vacuum ultraviolet light. By irradiating the liquid-repellent polymer layer with the vacuum ultraviolet light, the liquid-repellent polymer layer can be more efficiently decomposed to form a hydroxyl group at a portion where the liquid-repellent polymer layer is decomposed. The center wavelength of the vacuum ultraviolet light is about 10 to 200 nm.

The SAM treatment is performed on the portion in which the hydroxyl group is generated by UV irradiation. The SAM treatment is performed on the entire substrate in which the hydroxyl group is generated by UV irradiation, but the self-assembled monolayer can be selectively formed only at a portion irradiated with UV.

The self-assembled monolayer preferably has a linear alkyl group or fluoroalkyl group, and the terminal group is an alkyl group, a fluoroalkyl group, a phenyl group, or a fluorophenyl group. Such a self-assembled monolayer can easily separate electrodes formed on the self-assembled monolayer by coating and plating in later steps.

In the linear alkyl group $(CH)_n$, n is not particularly limited, and preferably is 8 to 18. Similarly, in the linear fluoroalkyl group $(CF)_n$, n is not particularly limited, and is preferably 1 to 10.

The self-assembled monolayer is, for example, decyltrimethoxysilane (DTS), triethoxy-1H, 1H, 2H, 2H-heptadecafluorodecylsilane (F-SAM), or trimethoxy(2-phenylethyl)silane (β-PTS), preferably F-SAM. In later steps, the electrodes formed on the self-assembled monolayer by coating and plating can be more easily separated.

A conductive ink containing metal particles is applied on the release layer. The method for applying the conductive ink is not particularly limited, and may be, for example, a blade coating method or the like. The conductive ink can be selectively applied only to the portion subjected to the SAM treatment. Since the portion subjected to the SAM treatment is lyophilic with respect to the solvent of the conductive ink and the photomask or the metal mask portion (liquid-repellent polymer layer) is liquid-repellent, the conductive ink can be selectively applied substantially only to the portion subjected to the SAM treatment. According to this method, the lower limit value of the channel length is preferably about 8 μm from the viewpoint of forming the parallelism of the channel length with high accuracy of 0.1 degrees or less, and high-definition patterning of, for example, L/S=10 μm/10 μm is possible.

The metal particles of the conductive ink are preferably Ag, Au, Pt, Cu, Pd, Ni, or a combination thereof.

The solvent of the conductive ink may be any solvent as long as the liquid-repellent polymer layer is relatively liquid-repellent and the portion subjected to the SAM treatment is relatively lyophilic. The solvent of the conductive ink is preferably a solvent in which the difference between the contact angle with the liquid-repellent polymer layer and the contact angle with the portion subjected to the SAM treatment is preferably 3° or more, more preferably 5° or more. The solvent of the conductive ink is more preferably an organic solvent of octane, toluene, tetradecane, butyl acetate, or a combination thereof. The solid content concentration in the solvent of the conductive ink is preferably 0.1 to 30 wt %.

Electroless plating is performed using the metal particles of the applied conductive ink as a catalyst to form electrodes with plating. By forming the electrodes for source/drain using plating, the work function of the electrode can be controlled, and carrier injection from the electrode to the organic semiconductor can be improved. In addition, by performing electroless plating using the metal particles of the applied conductive ink as a catalyst, plating is formed between the island-shaped metal particles, and the electrodes for source/drain having a surface roughness Rq of 2 nm or less can be obtained. That is, in the present embodiment comprising: forming the liquid-repellent polymer layer, forming the hydroxyl group at a portion in which the liquid-repellent polymer layer is decomposed, and performing SAM treatment at a portion in which the hydroxyl group is formed, the electrodes for source/drain comprise metal particles and plating. The plating is preferably Au plating, Ag plating, Pt plating, or Cu plating, more preferably Au plating. By providing the electrodes for source/drain with Au plating, the electrode having a high work function advantageous for carrier injection into an organic semiconductor can be formed.

The electroless plating may be an autocatalytic reduction plating conventionally used. In addition to metal ions and a reducing agent, the plating solution contains a buffer material for preventing pH fluctuation, a complexing agent for stabilizing the metal ions, and the like. When the substrate on which the conductive ink containing metal particles is applied is immersed in the plating solution, the metal ions in the plating solution can be precipitated by a reduction reaction using the metal particles as a catalyst to form a plating film.

In the method of the present disclosure, since the electrodes can be formed by the above process, ten or more sets of fine electrodes having a channel length of 200 µm or less and a surface roughness Rq of 2 nm or less can be provided, and such electrodes can be applied to manufacturing of a practical integrated circuit of an organic semiconductor device. Further, after forming the electrodes on the release layer as described above, the electrodes can be separated from the release layer and disposed on the organic semiconductor film as described later, so that the organic semiconductor film is small in damage and does not easily change with time. In the method of the present disclosure, since the electrodes can be formed by the above process, it is possible to obtain the electrodes having a parallelism of the channel length of preferably 1 degree or less in each set of the plurality of sets of 10 or more.

Figure 9:
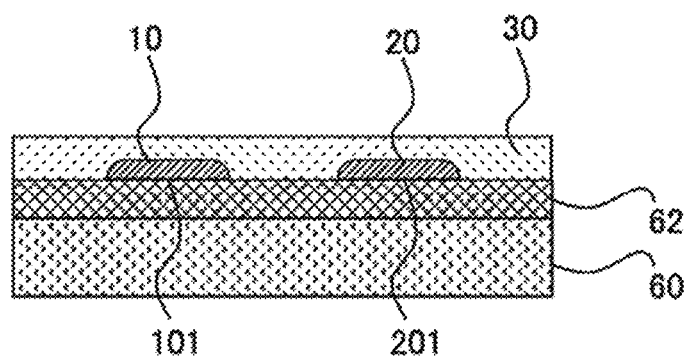
FIG. 9 is a cross-sectional schematic drawing of a substrate, a release layer, and electrodes on which a protective film is formed.

In the method of the present disclosure, the protective film is formed on the release layer and the electrodes. FIG. 9 shows a cross-sectional schematic drawing of the substrate 60, the release layer 62, and the electrodes 10 and 20 on which the protective film 30 is formed.

The protective film 30 can suppress separation, damage, or the like of the electrodes when removing the handling film in a later step. The protective film can also suppress peeling of the electrodes from the organic semiconductor film in the organic semiconductor device comprising the electrodes manufactured by the method of the present disclosure.

The protective film is composed of an insulating polymer having a thickness of 1 µm or less, is attached to a surface of the electrodes opposite to the surface of the electrodes by electrostatic force, and extends in at least a part of the channel.

The protective film 30 can be a fluorine-based polymer, such as polymethyl methacrylate (PMMA) and CYTOP (registered trademark), polyparaxylylene (parylene (registered trademark)), or polyadamantyl methacrylate (PADMA), which does not affect the characteristics of the organic semiconductor film.

The protective film 30 is preferably formed by a spin coating method or a chemical vapor deposition method.

When the electrodes are formed by a vacuum deposition method, the protective film is preferably PMMA, CYTOP (registered trademark), or PADMA formed by a spin coating method. The spin coating method is convenient and preferable from a practical viewpoint. The conditions of the spin coating method, such as the number of rotations, the time, and the like can be conventionally performed conditions, and may be appropriately set depending on the material of the protective film.

When the electrodes are formed by coating, or coating and plating, the protective film is preferably polyparaxylylene (parylene (registered trademark)), which can be formed by a chemical vapor deposition method which is a dry process. The protective film of parylene (registered trademark) can further prevent the electrodes formed by the coating method from dissolving. The chemical vapor deposition method can be performed by a conventional method, and for example, the dimer is heated to 170° C. to be evaporated, and further heated to 690° C. to cleave the dimer to form a monomer. The formed monomer is then introduced into a chamber in which the substrate is placed and maintained at room temperature, and is rapidly cooled to form a polymer by radical polymerization on the surface of the substrate, thereby forming a film.

Figure 10:
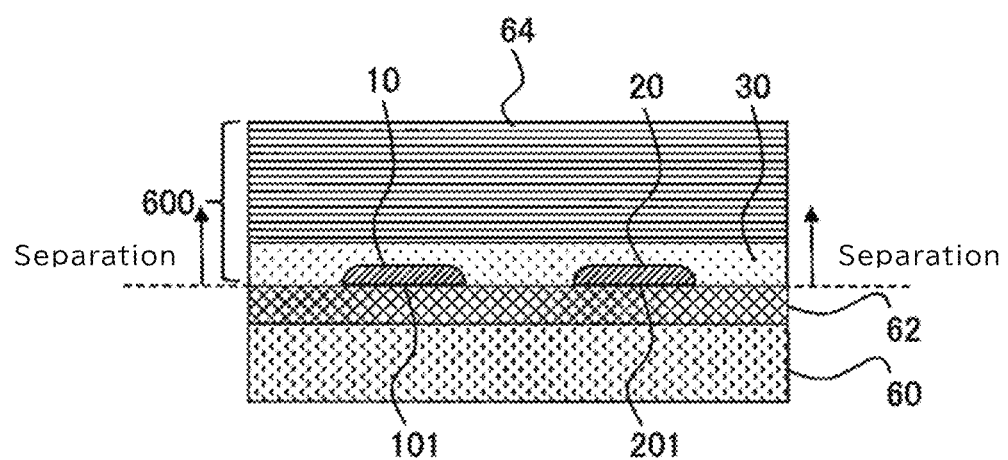
FIG. 10 is a cross-sectional schematic drawing of a substrate, a release layer, electrodes, and a protective film on which a handling film is formed.

In the method of the present disclosure, a handling film is formed on the formed protective film. FIG. 10 shows a cross-sectional schematic drawing of the substrate 60, the release layer 62, the electrodes 10 and 20, and the protective film 30 on which the handling film 64 is formed.

The handling film 64 is formed as a handling film for separating the electrodes 10 and 20 and the protective film 30 from the release layer 62 as shown in FIG. 10. When the electrode film, the protective film, and the handling film are disposed on the organic semiconductor film without removing the handling film 64 in a later step, the handling film 64 can also function as a handling film for disposing the electrode film having the protective film on the organic semiconductor film.

The thickness of the handling film 64 is not particularly limited as long as it can handle the electrodes 10 and 20 and the protective film 30, but is preferably 10 µm or more. The upper limit of the thickness of the handling film 64 is not particularly limited, but is preferably 100 µm or less because the larger the thickness, the longer the removal of the handling film takes time.

The handling film 64 is preferably a material corresponding to the protective film 30. When the protective film 30 is composed of a non-water-soluble polymer, the handling film 64 is preferably a water-soluble polymer film. When the protective film 30 is composed of a polymer that does not dissolve in an organic solvent, the handling film 64 is preferably an organic solvent-soluble polymer film. Since the handling film 64 is the preferable polymer film, the handling film can be easily removed by dissolving only the handling film 64 without dissolving the protective film 30 in the solution process.

When the handling film 64 is a water-soluble polymer film, an aqueous solution of a water-soluble polymer is applied on the protective film to form a water-soluble polymer film. The water-soluble polymer film can be removed by dissolving it in water after the electrodes 10 and 20 and the protective film 30 are separated from the release layer 62. When the electrode film, the protective film, and the handling film are disposed on the organic semiconductor film without removing the handling film 64 in the sequence step, the water-soluble polymer film can be removed by dissolving it in water after the electrode film and the protective film are disposed on the organic semiconductor film.

The water-soluble polymer of the water-soluble polymer film is preferably polyvinyl alcohol (PVA), polyacrylic acid, dextran, or polymethacrylic acid, more preferably polyvinyl alcohol (PVA).

When the handling film 64 is an organic solvent-soluble polymer film, an aqueous solution of the organic solvent-soluble polymer is applied on the protective film to form an organic solvent-soluble polymer film. The organic solvent-soluble polymer film can be removed by dissolving it in an organic solvent after the electrodes 10 and 20 and the protective film 30 are separated from the release layer 62. In the case where the electrode film, the protective film, and the handling film are disposed on the organic semiconductor film without removing the handling film 64 in the later step, the organic solvent soluble polymer film can be removed by dissolving it in an organic solvent after the electrode and the protective film are disposed on the organic semiconductor film.

The organic solvent-soluble polymer of the organic solvent-soluble polymer film is preferably polymethyl methacrylate (PMMA), polystyrene (PS), polyacrylonitrile (PAN), or polyethylene (PE), more preferably polymethyl methacrylate (PMMA).

After forming the handling film on the protective film, the interface between the release layer and the electrode and the protective film is separated to obtain an electrode film comprising the electrode, the protective film, and the handling film.

Figure 11:
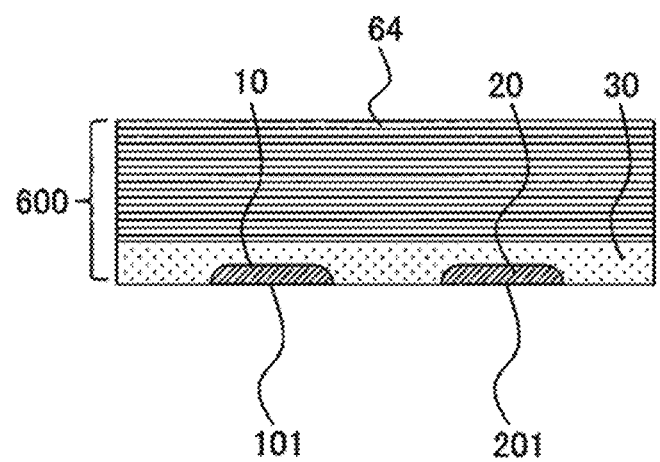
FIG. 11 is a cross-sectional schematic drawing of an electrode film in which a protective film is sandwiched between electrodes and a handling film.

By attaching a tape, such as a Kapton tape, to the surface of the handling film and pulling the tape, the interface between the release layer 62 and the electrodes 10, 20 and the protective film 30 is separated, as shown in FIG. 10, and an electrode film 600 comprising the electrodes 10, 20, the protective film 30, and the handling film 64 is obtained. FIG. 11 is a cross-sectional schematic drawing of the electrode film 600 in which the protective film 30 is sandwiched between the electrodes 10 and 20 and the handling film 64.

Figure 13:
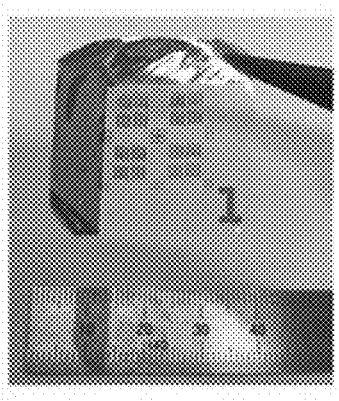
FIG. 13 is an external photograph of an electrode film in which a PMMA film, which is a protective film, is sandwiched between Au electrodes and a PVA film of a water-soluble polymer.
Figure 14:
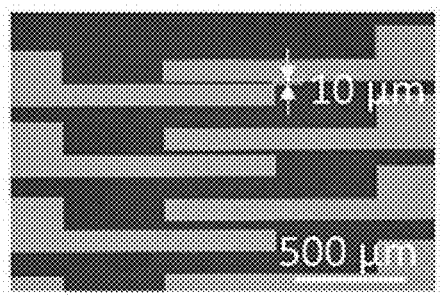
FIG. 14 is a microscopic photograph of the Au electrode pattern of FIG. 13 in an enlarged scale.

FIG. 13 shows an external photograph of an electrode film in which a PMMA film as a protective film is sandwiched between an Au electrode and a PVA film of a water-soluble polymer. FIG. 14 shows an enlarged microscopic photograph of the Au electrode pattern of FIG. 13. The first to third electrodes from the top of FIG. 14 have a channel width of 500 μm, and channel lengths of 10 μm, 20 μm, and 40 μm, respectively.

The handling film 64 is removed from the electrode film 600. The removal of the handling film 64 can be performed by a method depending on the material constituting the handling film.

When the handling film is composed of a water-soluble polymer, water is applied to the electrode film to remove the handling film.

When water is applied to remove the handling film, preferably, water is first dropped on the handling film, and when the handling film is substantially peeled off, water is added until the entire electrode film is immersed, and the water in which the electrode film is immersed is stirred until the handling film is dissolved to be substantially removed from the electrode film.

By removing the handling film, electrodes on which the protective film is disposed can be obtained. When the protective film is composed of a non-water-soluble polymer, it may be removed by an organic solvent, such as acetonitrile. When the protective film is composed of a polymer that is not dissolved in an organic solvent, it may be removed by a solvent, such as a fluorine-based solvent. A solvent for dissolving the protective film may be used depending on the type of the polymer constituting the protective film.

The present disclosure is also directed to a method for manufacturing an organic semiconductor device, comprising: preparing a substrate having a surface roughness Rq of 2 nm or less, forming a release layer on the surface of the substrate, forming 10 or more sets of electrodes for source/drain having a channel length of 200 μm or less on the release layer, forming a protective film on the release layer and the electrodes, forming a handling film on the protective film, separating an interface between the release layer and the electrodes and the protective film to obtain an electrode film comprising the electrodes, the protective film, and the handling film, disposing the electrode film on the organic semiconductor film, and removing the handling film.

Figure 12:
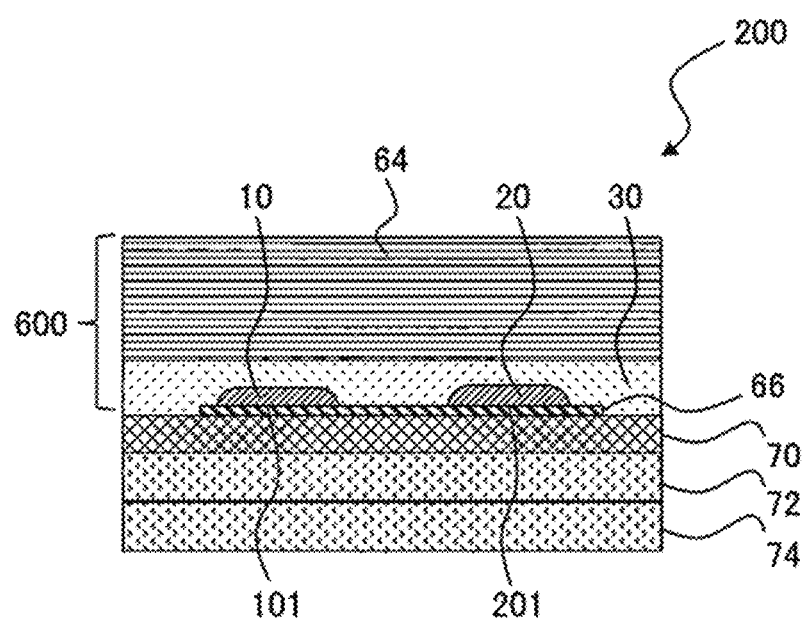
FIG. 12 is a cross-sectional schematic drawing of an electrode film disposed on the organic semiconductor film 66.

As shown in FIG. 12, the electrode film 600 obtained in the above method for manufacturing electrodes for source/drain of the organic semiconductor device is disposed on the organic semiconductor film 66. When disposing the electrode film 600 on the organic semiconductor film 66, the electrode film and the organic semiconductor film are brought into contact with each other so that the protective film 30 and the organic semiconductor film 66 are in close contact with each other.

FIG. 12 is a cross-sectional schematic drawing of an example of an organic semiconductor device 200 in which an electrode film 600 comprising the electrodes 10 and 20, the protective film 30, and the handling film 64 is disposed on the organic semiconductor film 66. After disposing the electrode film 600 on the organic semiconductor film 66, the handling film 64 is removed.

The organic semiconductor device 200 is an organic field-effect transistor having a bottom gate/top contact structure. The organic semiconductor film 66 is formed on the gate electrode 74 and the underlying layers (gate insulating films) 70 and 72. The gate electrode 74 can be a material conventionally used, for example, doped-Si or the like. The underlying layers 70 and 72 can also be materials conventionally used, such as $SiO_2$, parylene (registered trademark), or the like.

When disposing the electrode film 600 on the organic semiconductor film 66, it is preferable to heat the temperature of the organic semiconductor film 66 to 50 to 90° C., more preferably 60 to 80° C. The heating may be performed using a hot plate or the like.

By heating the organic semiconductor film 66 to the preferable temperature, the protective film 30 and the handling film 64 become soft, it becomes easier to dispose the protective film 30 along the surface shape of the electrodes 10 and 20 and so as to adhere to the surface of the organic semiconductor film 66, and the adhesion between the protective film 30 and the organic semiconductor film 66 is improved. When heating the organic semiconductor film 66 to the preferable temperature, the entire substrate on which the organic semiconductor film 66 is disposed can be heated.

Preferably, after the electrode film 600 is disposed on the organic semiconductor film 66 at room temperature, the organic semiconductor film 66 is heated from the substrate side. By heating the electrode film 600 after disposing the electrode film 600 on the organic semiconductor film 66, it is possible to more favorably dispose the protective film 30 so as to adhere to the surface of the organic semiconductor film 66 along the surface shape of the electrodes 10 and 20, and it is possible to further improve the adhesion between the protective film 30 and the organic semiconductor film 66.

After the electrode film is disposed on the organic semiconductor film, the handling film 64 is removed. The removal of the handling film 64 can be performed by a method depending on the material constituting the handling film.

When the handling film is composed of a water-soluble polymer, preferably, water is applied to the electrode film disposed on the organic semiconductor film while the substrate, the organic semiconductor film, and the electrode film are heated to remove the handling film.

When water is applied to remove the handling film, the temperature of the film may be lowered to 20 to 40° C. The application of water to the electrode film preferably initially drops water on the handling film, and when the handling film is substantially peeled off, water is added until the entire electrode film is immersed, and the water in which the electrode film is immersed is stirred until the handling film is dissolved to be substantially removed from the electrode film.

Figure 15:
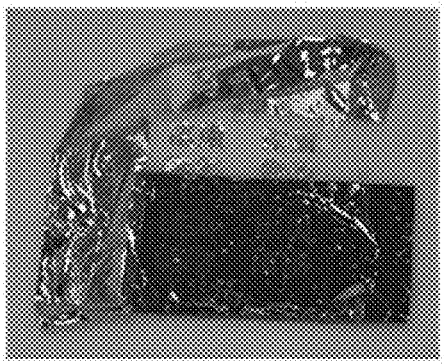
FIG. 15 is an external photograph of the obtained organic semiconductor device.

By removing the handling film, an organic semiconductor device in which electrodes and a protective film are disposed on the organic semiconductor film can be obtained. FIG. 15 shows an external photograph of the obtained organic semiconductor device. In the organic semiconductor device shown in FIG. 15, Au electrodes and a protective film of PMMA are formed on the organic semiconductor film.

According to the method of the present disclosure, an organic semiconductor device, such as an organic field-effect transistor, can be manufactured without damaging the organic semiconductor layer.

The organic semiconductor film is preferably an organic semiconductor single crystal film.

The average film thickness of the organic semiconductor single crystal film is 2 to 100 nm, preferably 4 to 20 nm. By having the average film thickness of the organic semiconductor single crystal film in the range, good device characteristics can be obtained. The average film thickness of the organic semiconductor single crystal film can be measured using a stylus type surface profile measuring instrument or an atomic force microscope.

The organic semiconductor single crystal film preferably has 1 molecular layer (monolayer) to 50 molecular layers, more preferably 1 molecular layer to 10 molecular layers, still more preferably 1 molecular layer to 5 molecular layers, and still more preferably 1 molecular layer to 3 molecular layers in the thickness direction. The organic semiconductor single crystal film most preferably has one molecular layer, but may have two or more molecular layers in the thickness direction. The number of molecular layers of the organic semiconductor single crystal film can be measured by an atomic force microscope.

As the number of molecular layers of the organic semiconductor is smaller, the resistance of the bulk region of the organic semiconductor can be reduced, and the contact resistance can be lowered. The contact resistance is the sum of two kinds of resistance: the resistance of the bulk region of the organic semiconductor in the charge transport from the electrode/organic semiconductor interface to the channel region, and the resistance in the charge injection from the electrode to the organic semiconductor layer. The channel region in which carriers are accumulated corresponds to one layer to several molecular layers of the organic semiconductor layer at the interface of the gate insulating film, and the other layers prevent smooth carrier injection from the electrode to the channel.

In the method of the present disclosure, since the electrodes formed on the flat substrate are disposed on the organic semiconductor film, thermal damage such as that applied in the vapor deposition process or damage due to a resist, an etchant, or the like during the photolithography process is not applied to the organic semiconductor film. Therefore, the organic semiconductor device operates well as without damaging the organic semiconductor film even if the organic semiconductor film is an organic semiconductor single crystal film with one molecular layer in the thickness direction.

The thickness of one molecular layer of the organic semiconductor single crystal film is preferably 2 to 6 nm, more preferably 2 to 4 nm. The thickness of one molecular layer of the organic semiconductor single crystal film can be measured by combining single crystal X-ray structure analysis and atomic force microscope observation.

The area of the organic semiconducting single-crystal film is preferably 2 $mm^2$ or more, more preferably 10 $mm^2$ or more, even more preferably 100 $mm^2$ or more, even more preferably 1000 $mm^2$ or more, and even more preferably 10000 $mm^2$ or more. The upper limit of the area of the organic semiconductor single crystal film is not particularly limited, and may be limited by the size of the manufacturing facility and may be, for example, 10 $m^2$. Conventionally, when a vapor phase growth method is used, only an organic semiconductor single crystal film having an area of at most about 1 $mm^2$ could be obtained, whereas the organic semiconductor device of the present disclosure can have a large area as described above.

The organic semiconductor single crystal film is composed of a single domain or multi-domain, and preferably is composed of a single domain. The domain of the organic semiconductor single crystal film can be measured by single crystal X-ray diffraction. The organic semiconductor single crystal film preferably has a single domain with a contiguous area of 0.005 $mm^2$ or more, more preferably 0.5 $mm^2$ or more, and even more preferably 2.0 $mm^2$ or more.

The organic semiconductor single crystal film exhibits a mobility of preferably 0.5 $cm^2/V\cdot s$ or more, more preferably 3.0 $cm^2/V\cdot s$ or more, even more preferably 5.0 $cm^2/V\cdot s$ or more, even more preferably 7.5 $cm^2/V\cdot s$ or more, and even more preferably 10 $cm^2/V\cdot s$ or more. The mobility of the organic semiconductor single crystal film can be calculated from the measurement results of the organic field effect transistor.

The type of the organic semiconductor constituting the organic semiconductor film is not particularly limited, and for example, a polycyclic aromatic compound of four or more rings, or a polycyclic compound of four or more rings formed of one or more unsaturated five-membered heterocyclic compounds and a plurality of benzene rings can be used.

The organic semiconductor constituting the organic semiconductor film is preferably a material having a high self-aggregation ability, such as a p-type organic semiconductor Cn-DNBDT-NW of the following formula (1) exhibiting a high mobility.

[Chemical Formula 1]

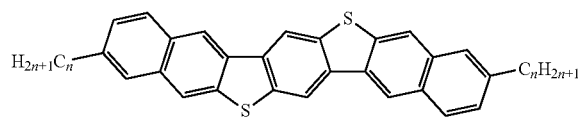

(1)

In formula (1), n may be 1 to 14. The self-aggregation ability refers to a tendency of molecules to spontaneously aggregate and crystallize as the molecules precipitate from a solvent.

Other examples of the organic semiconductor constituting the organic semiconductor film are shown in the following formulas (2) to (6).

[Chemical Formula 2]

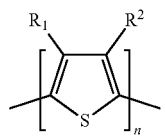

(2)

In the polythiophene semiconductor represented by Formula (2), R1 and R2 are each independently a hydrogen atom or an alkyl group having 4 to 10 carbon atoms. The alkyl group may comprise a heteroatom (typically selected from an oxygen atom and a sulfur atom). In addition, R1 and R2 together can form a ring. For reasons of self-aggregation ability, preferably, R1 and R2 are each independently a hydrogen atom or an alkyl group having 5 to 8 carbon atoms. More preferably, each of R1 and R2 is independently a hydrogen atom or a hexyl group.

The n represents an integer of 5 to 100. The n indicates the average number of thiophene monomer units in the polythiophene semiconductor, i.e., the length of the polythiophene chain. From the viewpoint of forming the single crystal film, the n is preferably 50 or less.

[Chemical Formula 3]

(ii)

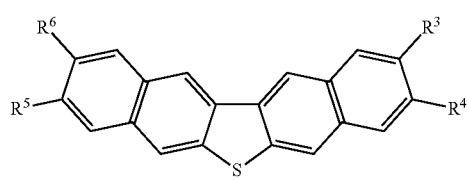

(3)

In Formula (3), each of R3, R4, R5 and R6 is independently a hydrogen atom or an alkyl group having 1 to 14 carbon atoms. The alkyl group may comprise a heteroatom (typically selected from an oxygen atom and a sulfur atom), and the hydrogen atom in the alkyl group may be substituted with a substituent, such as a halogen atom. For reasons of self-aggregation ability, R4=R5 is preferred, and R3=R6 is preferred. From the viewpoint of solubility, preferably, R4 and R5 are hydrogen atoms, and R3 and R6 are each independently an alkyl group having 1 to 14 carbon atoms, or R3 and R6 are hydrogen atoms, and R4 and R5 are each independently an alkyl group having 1 to 14 carbon atoms. More preferably, R3 and R6 are hydrogen atoms, and R4 and R5 are each independently an alkyl group having 1 to 14 carbon atoms. For reasons of self-aggregation ability, the carbon number of the alkyl group is preferably from 4 to 12, more preferably from 6 to 10.

[Chemical Formula 4]

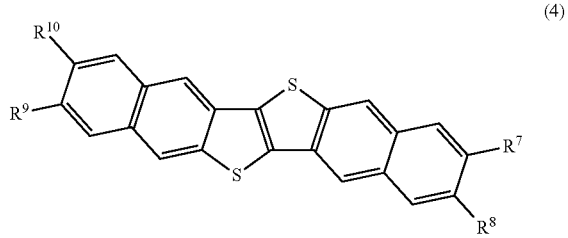

(4)

In Formula (4), each of R7, R8, R9 and R10 is independently a hydrogen atom or an alkyl group having 1 to 14 carbon atoms. The alkyl group may comprise a heteroatom (typically selected from an oxygen atom and a sulfur atom), and the hydrogen atom in the alkyl group may be substituted with a substituent, such as a halogen atom. For reasons of self-aggregation ability, R7=R9 is preferred, and R8=R10 is preferred. From the viewpoint of solubility, preferably, R7 and R9 are hydrogen atoms, and R8 and R10 are each independently an alkyl group having 1 to 14 carbon atoms, or R8 and R10 are hydrogen atoms, and R7 and R9 are each independently an alkyl group having 1 to 14 carbon atoms. More preferably, R8 and R10 are hydrogen atoms, and R7 and R9 are each independently an alkyl group having 1 to 14 carbon atoms. For reasons of self-aggregation ability, the carbon number of the alkyl group is preferably from 6 to 13, more preferably from 8 to 10.

[Chemical Formula 5]

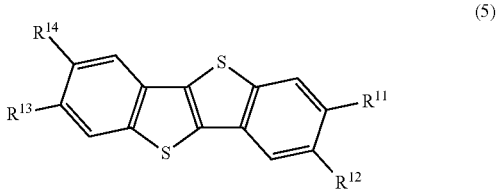

(5)

In Formula (5), each of R11, R12, R13 and R14 is independently a hydrogen atom or an alkyl group having 1 to 14 carbon atoms. The alkyl group may comprise a heteroatom (typically selected from an oxygen atom and a sulfur atom), and the hydrogen atom in the alkyl group may be substituted with a substituent, such as a halogen atom. For reasons of self-aggregation ability, R11=R13 is preferred, and R12=R14 is preferred. From the viewpoint of solubility, preferably, R11 and R13 are hydrogen atoms, and R12 and R14 are each independently an alkyl group having 1 to 14 carbon atoms, or R12 and R14 are hydrogen atoms, and R11 and R13 are each independently an alkyl group having 1 to 14 carbon atoms. More preferably, R12 and R14 are hydrogen atoms, and R11 and R13 are each independently an alkyl group having 1 to 14 carbon atoms. For reasons of self-aggregation ability, the number of carbon atoms of the alkyl group is preferably from 5 to 12, more preferably from 8 to 10.

[Chemical Formula 6]

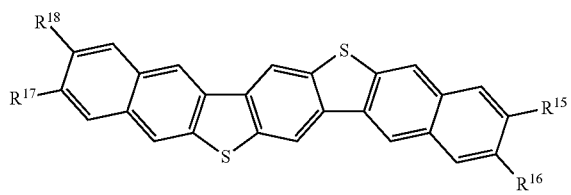

(6)

In formula (6), R15, R16, R17 and R18 are each independently a hydrogen atom or an alkyl group having 1 to 14 carbon atoms. The alkyl group may comprise a heteroatom (typically selected from an oxygen atom and a sulfur atom), and the hydrogen atom in the alkyl group may be substituted with a substituent, such as a halogen atom. For reasons of self-aggregation ability, R15=R17 is preferred, and R16=R18 is preferred. From the viewpoint of solubility, preferably, R16 and R18 are hydrogen atoms, and R15 and R17 are each independently an alkyl group having 1 to 14 carbon atoms, or R15 and R17 are hydrogen atoms, and R16 and R18 are each independently an alkyl group having 1 to 14 carbon atoms. More preferably, R16 and R18 are hydrogen atoms, and R15 and R17 are each independently an alkyl group having 1 to 14 carbon atoms. For reasons of self-aggregation ability, the number of carbon atoms of the alkyl group is preferably from 5 to 12, more preferably from 8 to 10.

Yet another examples of the organic semiconductor constituting the organic semiconductor film are shown in the following formulas (7) to (15). In Formula (7) to Formula (15), R may be linear alkyl, branched alkyl, fluorinated linear/branched alkyl, triisopropylsilylethynyl, phenyl, or the like.

[Chemical Formula 7]

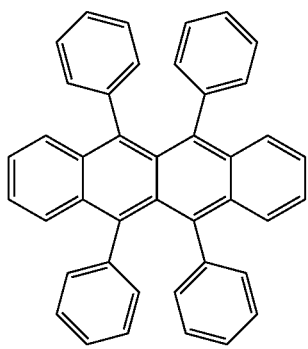

(7)

[Chemical Formula 8]

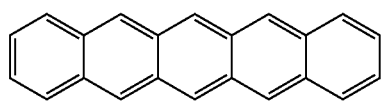

(8)

[Chemical Formula 9]

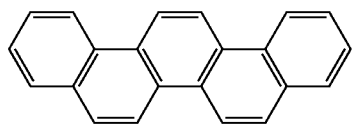

(9)

[Chemical Formula 10]

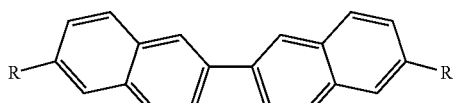

(10)

[Chemical Formula 11]

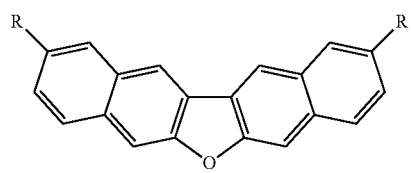

(11)

[Chemical Formula 12]

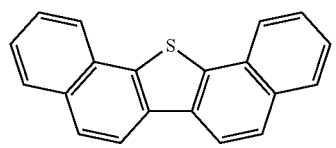

(12)

[Chemical Formula 13]

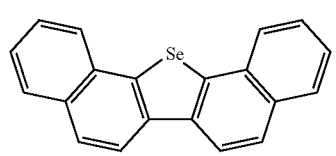

(13)

[Chemical Formula 14]

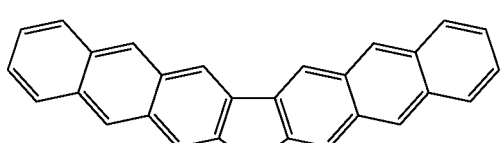

(14)

[Chemical Formula 15]

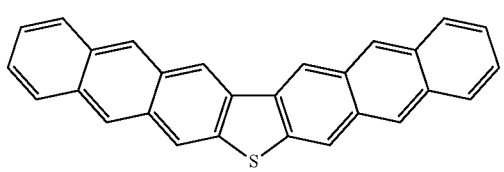

(15)

Whether or not the organic semiconductor film is a single crystal can be confirmed by observation with a transmission electron microscope (TEM).

The organic semiconductor single crystal film can be formed by a coating method. As the coating method, a method conventionally used can be used, and for example, an edge casting method, a continuous edge casting method, a drop casting method, a spin coating method, a printing method (ink jet method or gravure printing method), a dispenser method, a spray method, a dip coating method, a die coater method, a roll coater method, a bar coater method, a blade coating method, or the like can be used. Among these, the continuous edge casting method is preferable because it can obtain an organic semiconductor single crystal film having a thickness in which the film thickness is controlled to be very thin, and it is easy to control the thickness to about 1 molecular layer to 3 molecular layers.

Preferably, a carrier injection promoting film is disposed between the electrode and the organic semiconductor film. By disposing the carrier injection promoting film between the electrode and the organic semiconductor film, injection of carriers into the organic semiconductor film can be promoted.

The carrier injection promoting film may be disposed in an island shape between the electrodes and the organic semiconductor film.

The thickness of the carrier injection promoting film is preferably 1 to 4 nm, more preferably 2 to 3 nm.

A carrier injection promoting layer is formed on the release layer, an electrode material is vacuum-deposited on the carrier injection promoting layer, and patterning is performed by photolithography. The protective film is then separated, and the carrier injection promoting layer, the electrodes, and the protective film can be disposed so that the carrier injection promoting layer is in contact with the organic semiconductor film. After forming the carrier injection promoting layer on the release layer, instead of the vacuum deposition method, a conductive ink may be applied on the carrier injection promoting layer, and then electroless plating may be performed to form electrodes.

The carrier injection promoting layer is preferably 2,3,5,6-tetrafluoro-7,7,8,8-tetracyanoquinodimethane ($F_4$-TCNQ).

The carrier injection promoting layer can be formed on the release layer by vacuum deposition.

The surface of the electrode may be modified with a self-assembled monolayer, such as pentafluorobenzenethiol (PFBT) or 4-methylbenzenethiol (MBT). Thus, the work function of the electrode can be controlled, and carrier injection from the electrode to the organic semiconductor can be improved.

When forming PFBT or MBT on the electrode, the separated electrode film is immersed in ethanol in which PFBT or MBT is dissolved. Thus, PFBT or MBT can be formed on the electrode surface.

EXAMPLES

Example 1

As a substrate, an Eagle glass (EAGLE XG (registered trademark) of Corning) was prepared and subjected to UV-ozone (UV/$O_3$) treatment to form a hydroxyl group on the glass surface. The UV ozone treatment was performed by UV irradiation for 15 minutes under an oxygen atmosphere using UV lamps UV 253H (wavelengths of 184.9 nm and 253.7 nm) manufactured by Filgen Corporation.

The glass substrate on which the hydroxyl group was formed was subjected to SAM treatment, and a self-assembled monolayer of decyltrimethoxysilane (DTS) was formed as a release layer on the surface of the glass substrate. The SAM treatment was performed by disposing the DTS solution and the glass substrate on which the hydroxyl group was formed in a sealed container, heating to 120° C. to form a saturated vapor atmosphere of the DTS molecules, standing the glass substrate on which the hydroxyl group was formed in the saturated vapor atmosphere of the DTS molecules for 3 hours, and washing the glass substrate with toluene followed by washing with 2-propanol.

On the glass substrate on which the self-assembled monolayer of DTS was formed, Au was patterned by vacuum deposition and photolithography to form a total of 96 sets of 16 sets each of Au electrodes having a thickness of 40 nm and channel lengths/channel widths=100 μm/500 μm, 80 μm/500 μm, 60 μm/500 μm, 40 μm/500 μm, 20 μm/500 μm, and 10 μm/500 μm.

A solution in which 3 mass % of polymethyl methacrylate (PMMA) was dissolved in butyl acetate was spin-coated on the glass substrate on which the Au electrodes were formed. In the spin coating, the number of rotations was increased to 500 rpm in 1 second, held at 500 rpm for 5 seconds, and held at 2000 rpm for 40 seconds. The rotation was stopped, and the substrate was dried at 80° C. for 30 minutes to remove the solvent to form a protective film of PMMA having a thickness of 75 nm.

A 5 mass % polyvinyl alcohol (PVA) aqueous solution of was applied on the protective film of PMMA, and dried at 50° C. for 2 hours to form a PVA handling film having a thickness of 10 μm.

The Kapton tape was attached to the handling film, and the electrode film comprising the Au electrodes, the PMMA protective film, and the PVA handling film was separated by pulling the Kapton tape. FIG. 13 shows an external photograph of the electrode film in which the PMMA protective film was sandwiched between the Au electrodes and the PVA handling film. FIG. 14 shows an enlarged microscopic photograph of the Au electrode pattern of FIG. 13. The first to third electrodes from the top of FIG. 14 have a channel width of 500 μm, and channel lengths of 10 μm, 20 μm, and 40 μm, respectively.

The electrode film comprising the Au electrode, the PMMA protective film, and the PVA handling film was disposed on the glass plate so that the Au electrodes were fixed using a weight. Water was then dropped on the PVA handling film, and after the handling film was substantially peeled off, the temperature was lowered to 30° C., water was added until the entire electrode film was immersed, and the water in which the electrode film was immersed was stirred for 3 hours until the PVA was completely dissolved to remove the handling film, thereby fabricating Au electrodes having a PMMA protective film as shown in FIG. 4.

Next, the Au electrodes having the PMMA protective film was immersed in acetonitrile at 30° C. for 30 minutes to remove the PMMA protective film, and Au electrodes as shown in FIG. 2 were manufactured.

The channel length/channel width of the electrodes in each set of the obtained Au electrodes 64 was 100 μm/500 μm, 80 μm/500 μm, 60 μm/500 μm, 40 μm/500 μm, 20 μm/500 μm, and 10 μm/500 μm, respectively, and the surface roughness Rq of the electrodes was 0.6 nm. The parallelism of the channel length in each set of electrodes (one element) was 0.1 degrees or less.

Example 2

Au electrodes were manufactured in the same manner as in Example 1 except that 50 sets of Au electrodes having a thickness of 40 nm and a channel length/channel width=200 μm/1000 μm were formed. FIG. 30 shows a top surface photograph of 50 sets of Au electrodes having a thickness of 40 nm and a channel length/channel width=200 μm/1000 μm formed in a 1.5 cm square. FIG. 31 shows an enlarged photograph of a pair of electrodes for source/drain surrounded by a broken line in FIG. 30.

The channel length/channel width of the electrode in each set of the obtained 50 sets of Au electrodes was 200 μm/1000 μm, and the surface roughness Rq of the electrodes was 0.6 nm. The parallelism of the channel length in each set of electrodes (one element) was 0.1 degrees or less.

Example 3

An electrode film comprising Au electrodes, a PMMA protective film, and a PVA handling film was obtained in the same manner as in Example 1.

As an organic semiconductor, a powder of p-type organic semiconductor $C_9$-DNBDT-NW of the following formula (16):

[Chemical Formula 16]

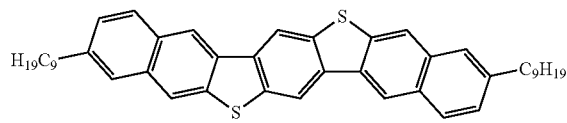

(16)

exhibiting high mobility was prepared. 3-chlorothiophene was used as a solvent, and the organic semiconductor powder was dissolved in the solvent to prepare an organic semiconductor solution.

A substrate in which doped-Si as a gate electrode having a thickness of 500 μm, an $SiO_2$ having a thickness of 100 nm, and parylene (diX-SR (registered trademark)) having a thickness of 70 nm were laminated was prepared.

The prepared organic semiconductor solution was applied on the substrate heated to 80° C. by the continuous edge casting method to form an organic semiconductor single crystal film of a monolayer on the substrate. The surface roughness Rq of the organic semiconductor film was 0.2 nm.

The laminate of the obtained doped-Si, $SiO_2$, parylene (diX-SR (registered trademark)), and the organic semiconductor film was disposed on the hot plate, and the electrode film was disposed on the organic semiconductor film so that the electrodes were in contact with the organic semiconductor film as schematically shown in FIG. 12 while being heated to 80° C.

Figure 42:
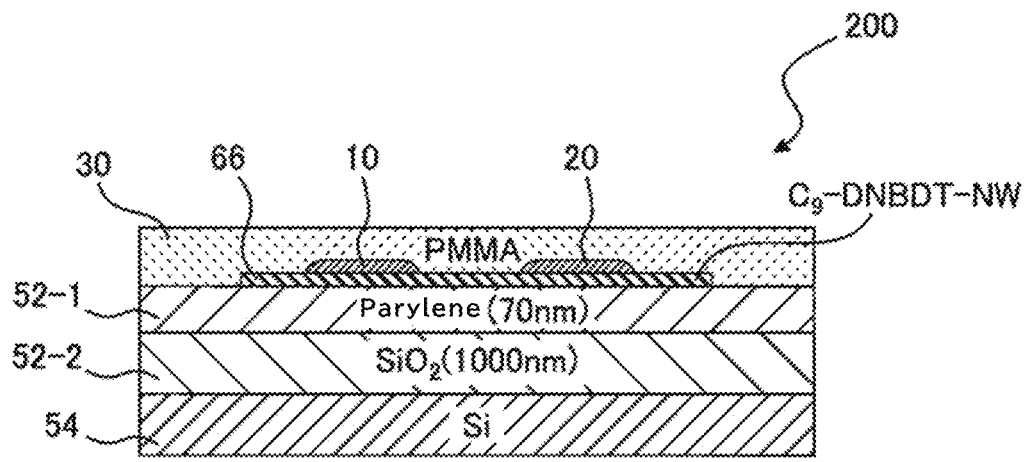
FIG. 42 is a schematic cross-sectional drawing of an organic semiconductor device comprising a gate electrode, a gate insulating film, an organic semiconductor film, and electrodes for source/drain of the present disclosure.

Water was dropped on the handling film of PVA while heating to 80° C., and after the handling film was substantially peeled off, the temperature was lowered to 30° C., water was added until the entire electrode film was immersed, and the water in which the electrode film was immersed was stirred for 3 hours until the PVA was completely dissolved to remove the handling film, thereby fabricating organic field-effect transistors having a bottom gate/top contact structure as schematically shown in FIG. 42.

Figure 18:
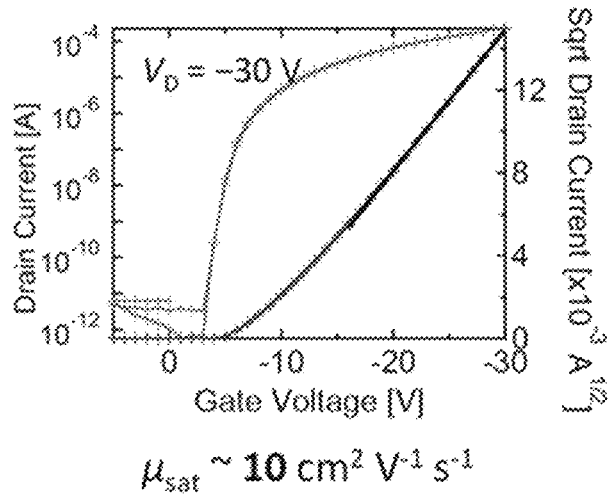
FIG. 18 is a graph of transfer characteristics representing a relationship between a gate voltage and a drain current in a saturation region.
Figure 19:
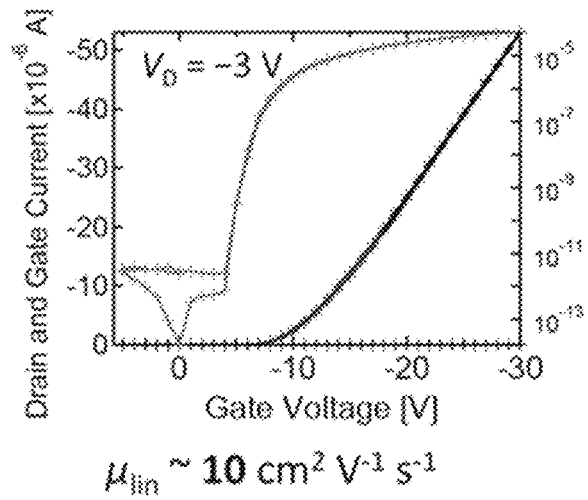
FIG. 19 is a graph of transfer characteristics representing a relationship between a gate voltage and a drain current in a linear region.
Figure 20:
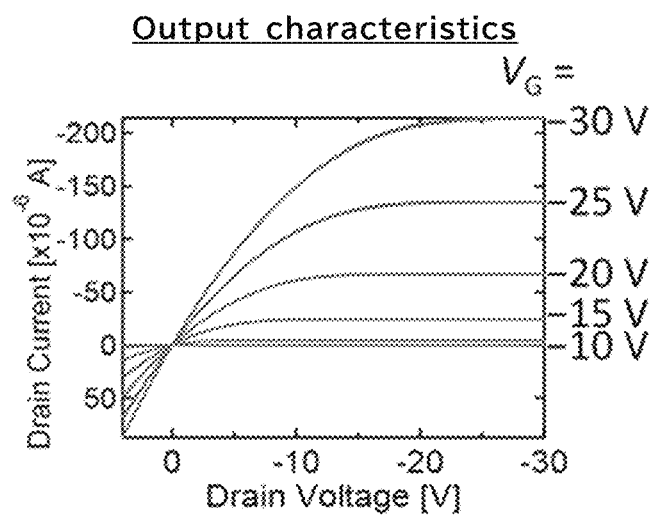
FIG. 20 is a graph of output characteristics representing a relationship between a drain voltage and a drain current depending on a gate voltage.

With respect to a transistor having the channel length/channel width of 100 μm/500 μm among the transistors manufactured with different channel lengths/channel widths, FIG. 18 shows a graph of the transfer characteristics representing the relationship between the gate voltage and the drain current in the saturation region, FIG. 19 shows a graph of the transfer characteristics representing the relationship between the gate voltage and the drain current in the linear region, and FIG. 20 shows a graph of the output characteristics representing the relationship between the drain voltage and the drain current depending on the gate voltage. The mobility in the saturated region was 10 $cm^2/V \cdot s$, and the mobility in the linear region was 10 $cm^2/V \cdot s$, which were very large mobility. In calculating the mobility, theoretical values were used for the capacitance of the insulating film in which the $SiO_2$ and the parylene (registered trademark) were laminated.

Example 4

Figure 21:
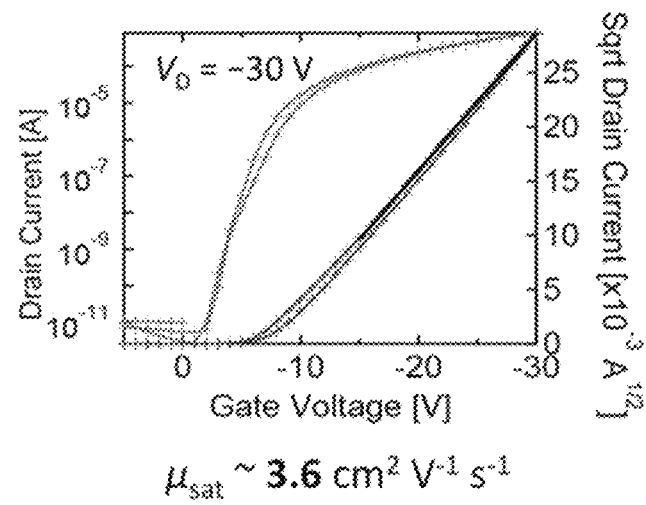
FIG. 21 is a graph of transfer characteristics representing a relationship between a gate voltage and a drain current in a saturation region.
Figure 22:
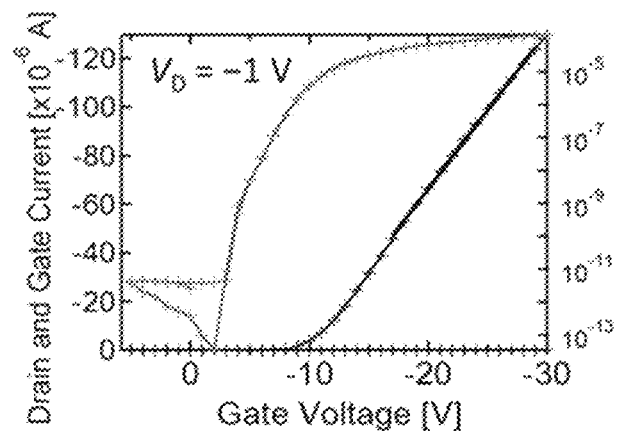
FIG. 22 is a graph of transfer characteristics representing a relationship between a gate voltage and a drain current in a linear region.
Figure 23:
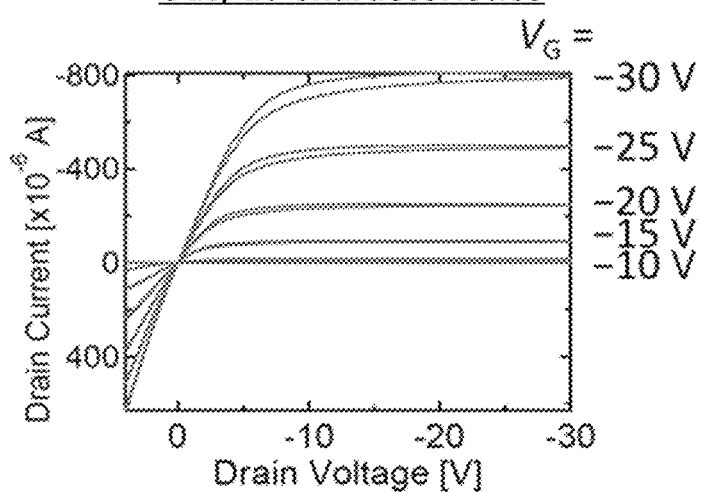
FIG. 23 is a graph of output characteristics representing a relationship between a drain voltage and a drain current depending on a gate voltage.

For the transistor having a channel length/channel width of 10 μm/500 μm manufactured in Example 3, FIG. 21 shows a graph of the transfer characteristics representing the relationship between the gate voltage and the drain current in the saturation region, FIG. 22 shows a graph of the transfer characteristics representing the relationship between the gate voltage and the drain current in the linear region, and FIG. 23 shows a graph of the output characteristics representing the relationship between the drain voltage and the drain current depending on the gate voltage. The mobility in the saturated region was 3.6 $cm^2/Vs$, the mobility in the linear region was 7.2 $cm^2/Vs$, and good mobility was obtained even in a short channel device having a channel length of 10 μm.

Example 5

Organic semiconductor devices were manufactured in the same manner as in Example 3 except that the release layer was changed to triethoxy-1H,1H,2H,2H-heptadecafluoro-decylsilane (F-SAM).

The mobility of the manufactured transistor having a channel length/channel width of 100 μm/500 μm was measured, and the same mobility as in Example 3 was shown.

Example 6

An electrode film comprising Au electrodes, a PMMA protective film, and a PVA handling film was obtained in the same manner as in Example 1 except that Au electrodes having a channel length/channel width=200 μm/1000 μm were formed in the same electrode pattern as in Example 2. Further, organic semiconductor devices were manufactured in the same manner as in Example 3 except that the release layer was changed to F-SAM, and parylene (diX-SR (registered trademark)) in the laminate was changed to trimethoxy(2-phenylethyl)silane (β-PTS) to obtain a laminate of doped-Si, $SiO_2$, β-PTS, and an organic semiconductor film.

Figure 16:
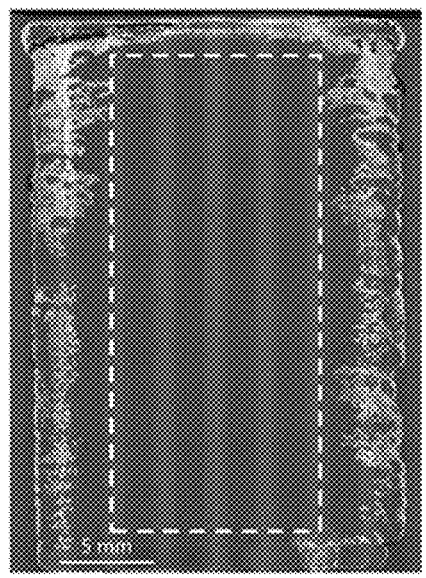
FIG. 16 is a laser confocal microscopic photograph of a monolayer film of $C_9$-DNBDT-NW formed by the continuous-edge casting method.

FIG. 16 shows a laser confocal microscopic photograph of the organic semiconductor ($C_9$-DNBDT-NW) film observed from the top surface of the fabricated organic semiconductor device. A single-crystalline domain thin film of a monolayer was obtained on the entire surface (area: 450 $mm^2$) surrounded by a broken line.

Figure 17:
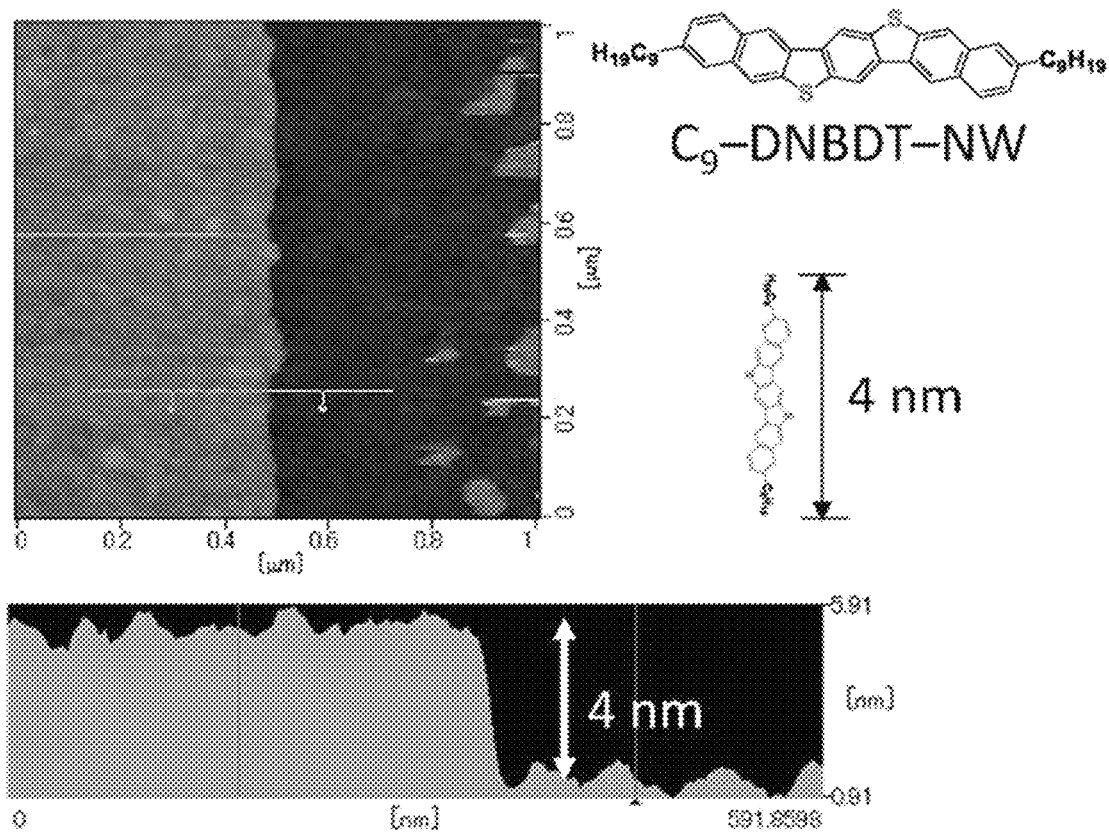
FIG. 17 is a result of measuring the monolayer film of the $C_9$-DNBDT-NW of FIG. 16 by atomic force microscopy (AFM).

FIG. 17 shows the results of measuring the monolayer film of the $C_9$-DNBDT-NW of FIG. 16 by atomic force microscopy (AFM). A thickness of 4 nm corresponding to one molecular layer of $C_9$-DNBDT-NW was obtained.

Figure 24:
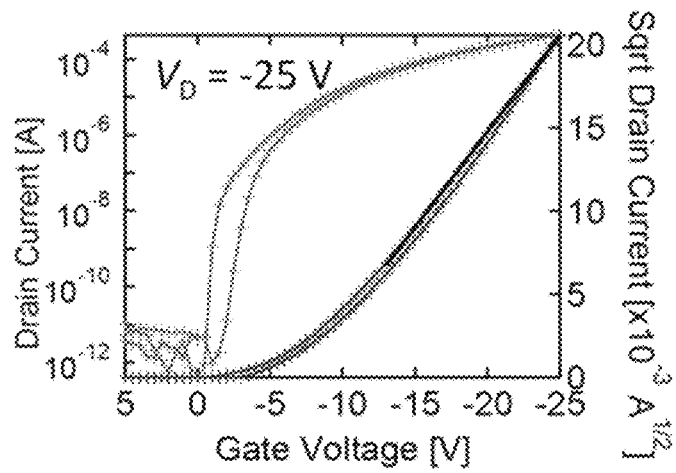
FIG. 24 is a graph of transfer characteristics representing a relationship between a gate voltage and a drain current in a saturation region.
Figure 25:
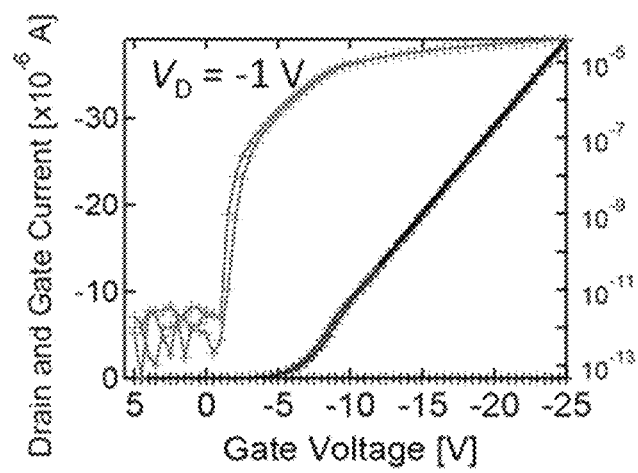
FIG. 25 is a graph of transfer characteristics representing a relationship between a gate voltage and a drain current in a linear region.
Figure 26:
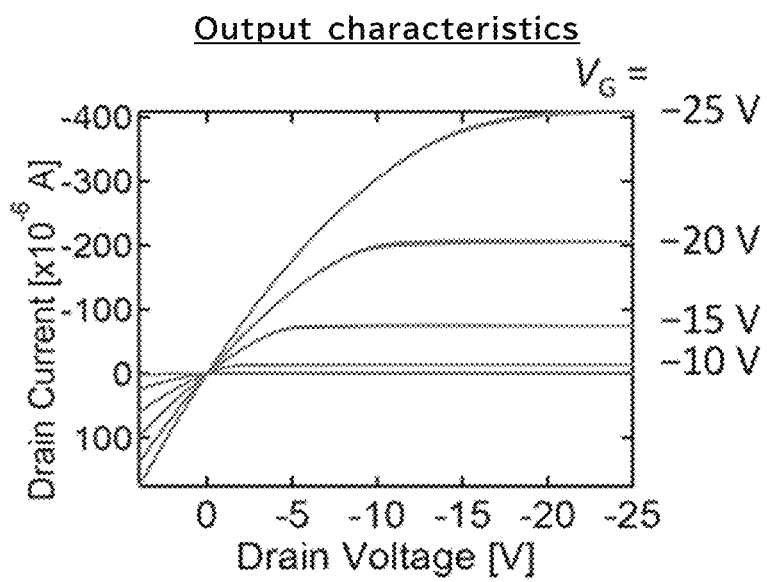
FIG. 26 is a graph of output characteristics representing a relationship between a drain voltage and a drain current depending on a gate voltage.

With respect to the manufactured transistor having a channel length/channel width of 200 μm/1000 μm, FIG. 24 shows a graph of the transfer characteristics representing the relationship between the gate voltage and the drain current in the saturation region, FIG. 25 shows a graph of the transfer characteristics representing the relationship between the gate voltage and the drain current in the linear region, and FIG. 26 shows a graph of the output characteristics representing the relationship between the drain voltage and the drain current depending on the gate voltage. The mobility in the saturated region was 15.3 $cm^2/Ns$, and the mobility in the linear region was 11.6 $cm^2/V \cdot s$, and a transistor having very large mobility could be manufactured even if the organic semiconducting film was single-crystal of a monolayer.

Example 7

Organic semiconductor devices were manufactured in the same manner as in Example 3 except that a carrier injection promoting layer of 2,3,5,6-tetrafluoro-7,7,8,8-tetracyanoquinodimethane ($F_4$-TCNQ) was formed on the release layer by vacuum deposition and Au electrodes were formed on the carrier injection promoting layer in the same manner as in Example 3.

Figure 27:
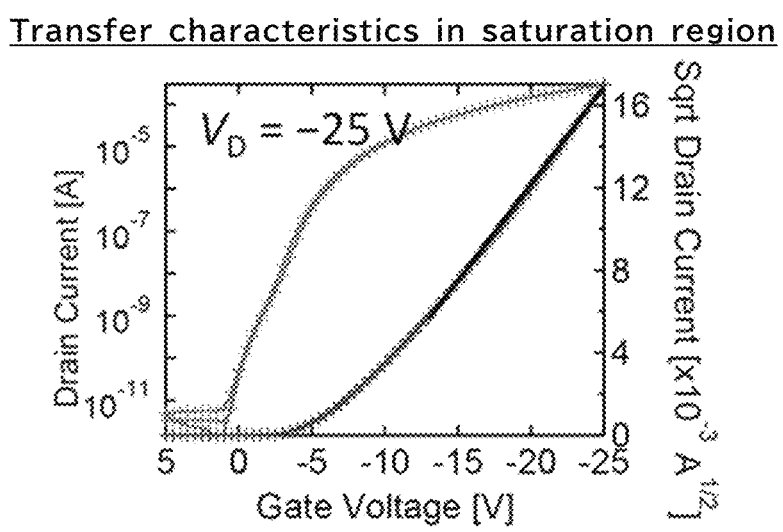
FIG. 27 is a graph of transfer characteristics representing a relationship between a gate voltage and a drain current in a saturation region.
Figure 28:
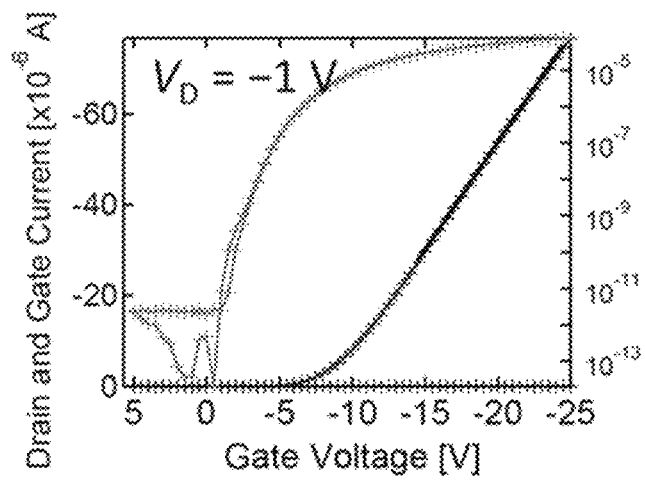
FIG. 28 is a graph of transfer characteristics representing a relationship between a gate voltage and a drain current in a linear region.
Figure 29:
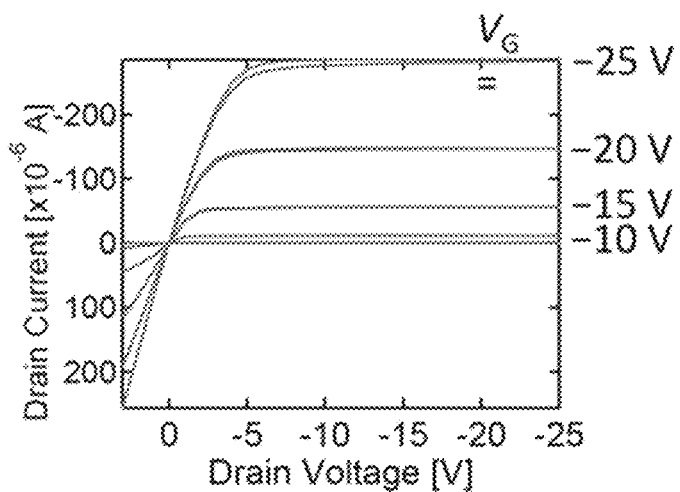
FIG. 29 is a graph of output characteristics representing a relationship between a drain voltage and a drain current depending on a gate voltage.

With respect to the manufactured transistor having a channel length/channel width of 10 μm/500 μm, FIG. 27 shows a graph of the transfer characteristics representing the relationship between the gate voltage and the drain current in the saturation region, FIG. 28 shows a graph of the transfer characteristics representing the relationship between the gate voltage and the drain current in the linear region, and FIG. 29 shows a graph of the output characteristics representing the relationship between the drain voltage and the drain current depending on the gate voltage. The mobility in the saturated region was 2 $cm^2/V \cdot s$, and the mobility in the linear region was 5.4 $cm^2Ns$, and good mobility was obtained.

Example 8

Organic semiconductor devices were manufactured in the same manner as in Example 3 except that the release layer was changed to triethoxy-1H,1H,2H,2H-heptadecafluorodecylsilane (F-SAM), the protective film was changed to CTX-809SP2 having a glass transition point of 108° C. in which a terminal group of CYTOP (registered trademark) is $CF_3$, and parylene (diX-SR (registered trademark)) in the laminate was changed to β-PTS to obtain a laminate of doped-Si, $SiO_2$, β-PTS, and an organic semiconductor film.

The CTX-809SP2 protective film of CYTOP (registered trademark) was formed in the following manner. A solution prepared by CTX-809SP2:CT-Solv.180 (solvent for dilution)=2:3 (mass ratio) was spin-coated on a glass substrate on which the Au electrodes were formed under the same conditions as in Example 1. The rotation was stopped, and the solvent was removed by drying at 50° C. for 1 minute, and then at 80° C. for 40 minutes, thereby forming an 809SP2 protective film having a thickness of 300 nm. In order to be able to apply PVA, the surface of CTX-809SP2 was modified by excimer light, and a PVA handling film was formed in the same manner as in Example 1.

Figure 32:
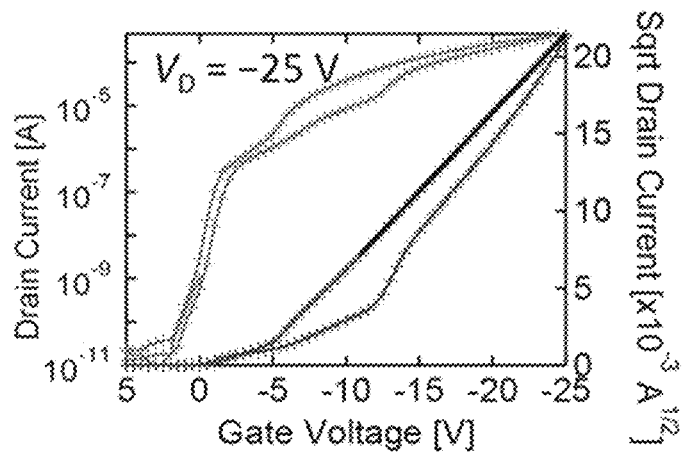
FIG. 32 is a graph of transfer characteristics representing a relationship between a gate voltage and a drain current in a saturation region.
Figure 33:
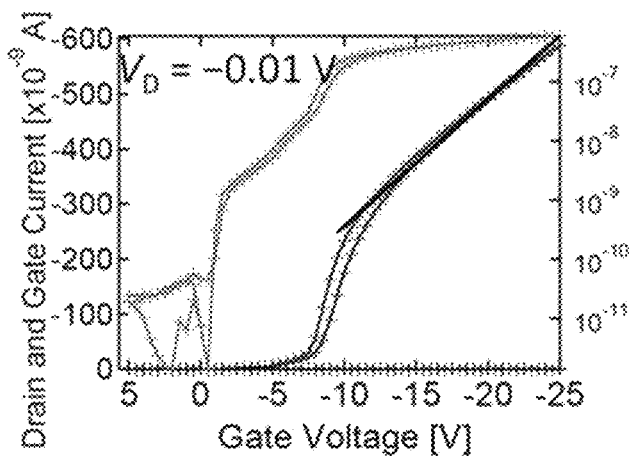
FIG. 33 is a graph of transfer characteristics representing a relationship between a gate voltage and a drain current in a linear region.
Figure 34:
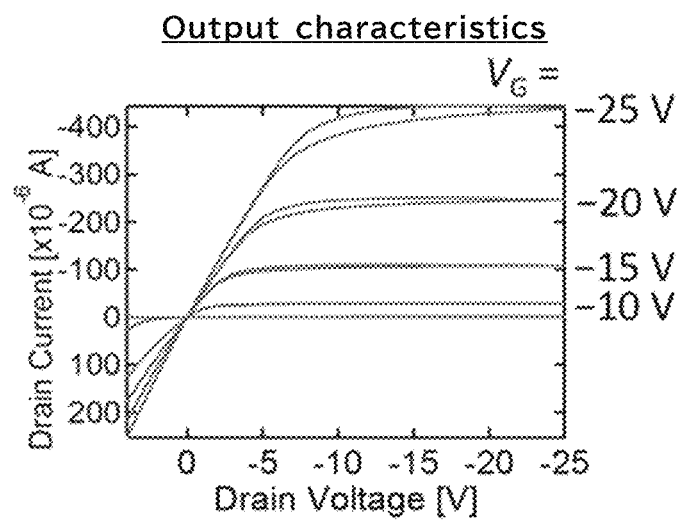
FIG. 34 is a graph of output characteristics representing a relationship between a drain voltage and a drain current depending on a gate voltage.

With respect to the manufactured transistor having a channel length/channel width of 100 μm/500 μm, FIG. 32 shows a graph of the transfer characteristics representing the relationship between the gate voltage and the drain current in the saturation region, FIG. 33 shows a graph of the transfer characteristics representing the relationship between the gate voltage and the drain current in the linear region, and FIG. 34 shows a graph of the output characteristics representing the relationship between the drain voltage and the drain current depending on the gate voltage. The mobility in the saturated region was 12 $cm^2Ns$, and the mobility in the linear region was 13 $cm^2Ns$, and good mobility was obtained.

Example 9

Organic semiconductor devices were manufactured in the same manner as in Example 8 except that a total of 112 sets of Au electrodes each having a channel length/channel width of 100 μm/500 μm, 80 μm/500 μm, 60 μm/500 μm, 40 μm/500 μm, 20 μm/500 μm, 10 μm/500 μm, and 200 μm/500 μm were formed, and the protective film was changed to CTL-809M having a glass transition point of 108° C. in which a terminal group of CYTOP (registered trademark) is —CONH—Si(OR)n.

The CTL-809M protective film was formed by the following method. A solution prepared by CTL-809M:CT-Solv.180 (solvent for dilution)=2:3 (mass ratio) was spin-coated on a glass substrate on which the Au electrodes were formed under the same conditions as in Example 1. The rotation was stopped, and the solvent was removed by drying at 50° C. for 40 minutes, thereby forming a CTL-809M protective film having a thickness of 300 nm. In order to be able to apply PVA, the surface of the CTL-809M protective film was modified by excimer light, and a PVA handling film was formed in the same manner as in Example 1.

Figure 35:
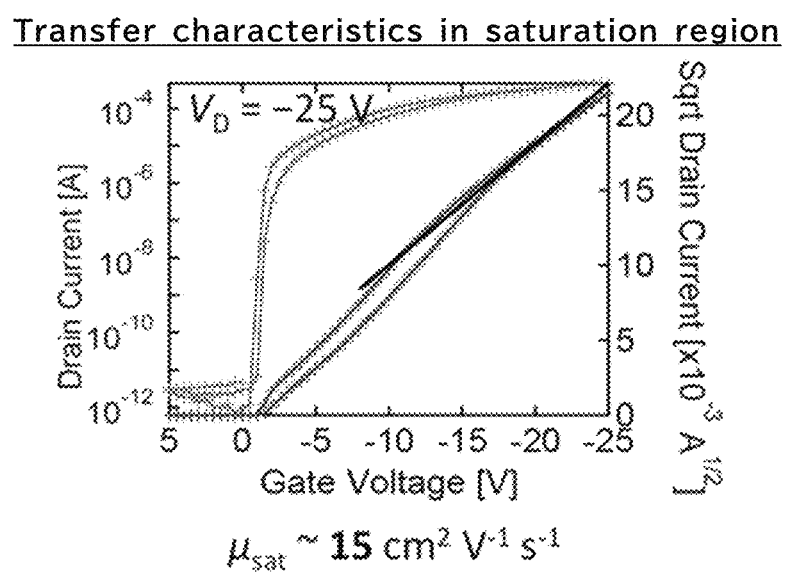
FIG. 35 is a graph of transfer characteristics representing a relationship between a gate voltage and a drain current in a saturation region.
Figure 36:
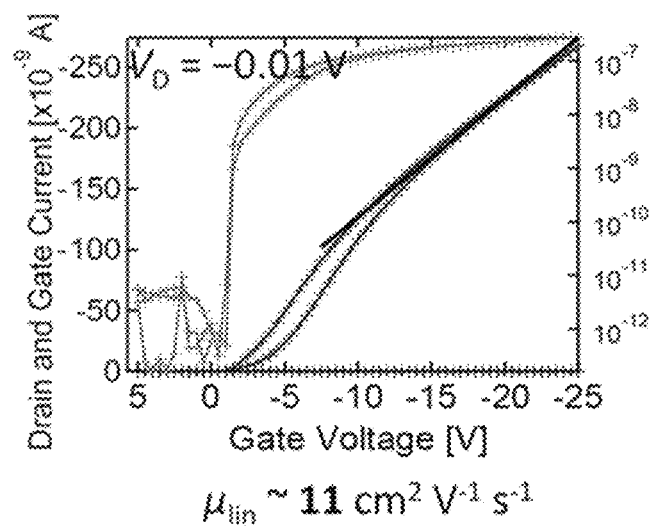
FIG. 36 is a graph of transfer characteristics representing a relationship between a gate voltage and a drain current in a linear region.
Figure 37:
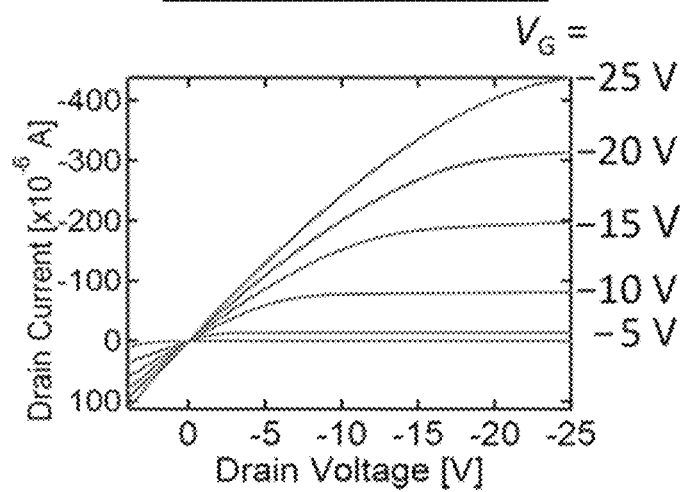
FIG. 37 is a graph of output characteristics representing a relationship between a drain voltage and a drain current depending on a gate voltage.

With respect to the manufactured transistor having a channel length/channel width of 200 μm/500 μm, FIG. 35 shows a graph of the transfer characteristics representing the relationship between the gate voltage and the drain current in the saturation region, FIG. 36 shows a graph of the transfer characteristics representing the relationship between the gate voltage and the drain current in the linear region, and FIG. 37 shows a graph of the output characteristics representing the relationship between the drain voltage and the drain current depending on the gate voltage. The mobility in the saturated region was 15 $cm^2Ns$, and the mobility in the linear region was 11 $cm^2Ns$, and good mobility was obtained.

Example 10

Organic semiconductor devices were manufactured in the same manner as in Example 3 except that the protective film was changed to polyadamantyl methacrylate (PADMA) having a glass transition point of 200° C. or more.

The protective film of PADMA was formed by the following method. A solution in which 2 mass % of PADMA was dissolved in cyclohexane was spin-coated on a glass substrate on which Au electrodes were formed under the same conditions as in Example 1. The rotation was stopped, and the solvent was dried at 50° C. for 30 seconds, and then dried at 80° C. for 15 minutes to remove the solvent, thereby forming a PADMA protective film having a thickness of 200 nm.

Figure 38:
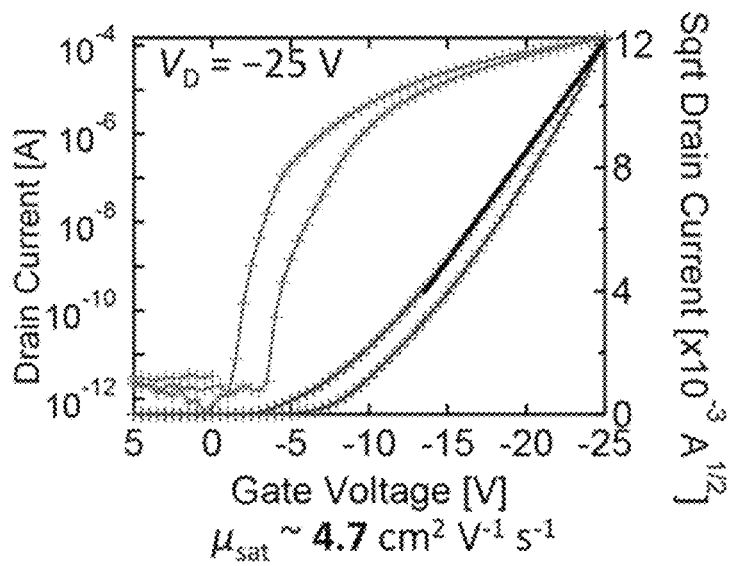
FIG. 38 is a graph of transfer characteristics representing a relationship between a gate voltage and a drain current in a saturation region.
Figure 39:
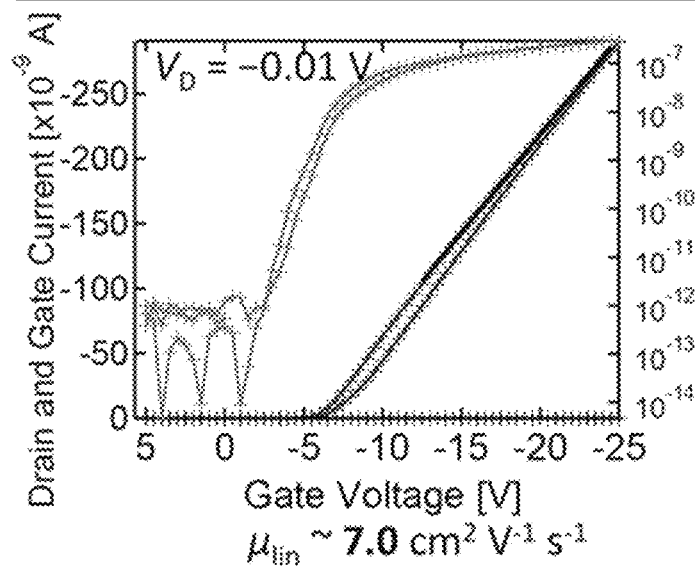
FIG. 39 is a graph of transfer characteristics representing a relationship between a gate voltage and a drain current in a linear region.
Figure 40:
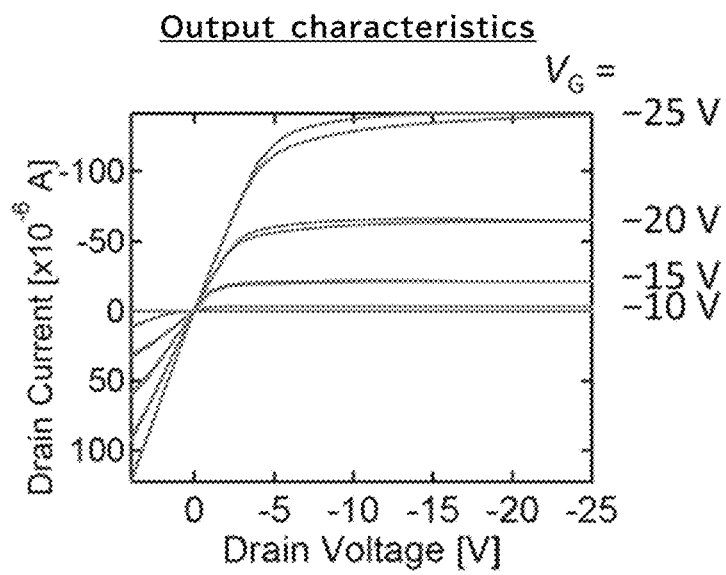
FIG. 40 is a graph of output characteristics representing a relationship between a drain voltage and a drain current depending on a gate voltage.

With respect to the manufactured transistor having a channel length/channel width of 80 μm/500 μm, FIG. 38 shows a graph of the transfer characteristics representing the relationship between the gate voltage and the drain current in the saturation region, FIG. 39 shows a graph of the transfer characteristics representing the relationship between the gate voltage and the drain current in the linear region, and FIG. 40 shows a graph of the output characteristics representing the relationship between the drain voltage and the drain current depending on the gate voltage. The mobility in the saturated region was 4.7 $cm^2Ns$, and the mobility in the linear region was 7.0 $cm^2/V \cdot s$, indicating good mobility.

Example 11

Figure 43:
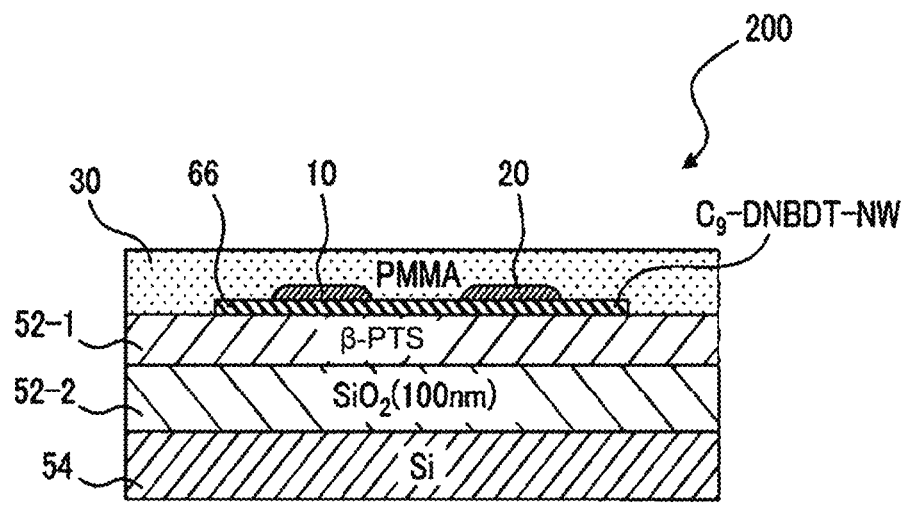
FIG. 43 is a schematic cross-sectional drawing of an organic semiconductor device comprising a gate electrode, a gate insulating film, an organic semiconductor film, and electrodes for source/drain of the present disclosure.

Organic semiconductor devices having a cross-sectional structure schematically shown in FIG. 43 were manufactured in the same manner as in Example 6 except that a total of 48 sets of 8 sets each of Au electrodes having channel lengths/channel widths of 100 μm/500 μm, 80 μm/500 μm, 60 μm/500 μm, 40 μm/500 μm, 20 μm/500 μm, and 10 μm/500 μm were formed in total in the same manner as in Example 1.

Figure 44:
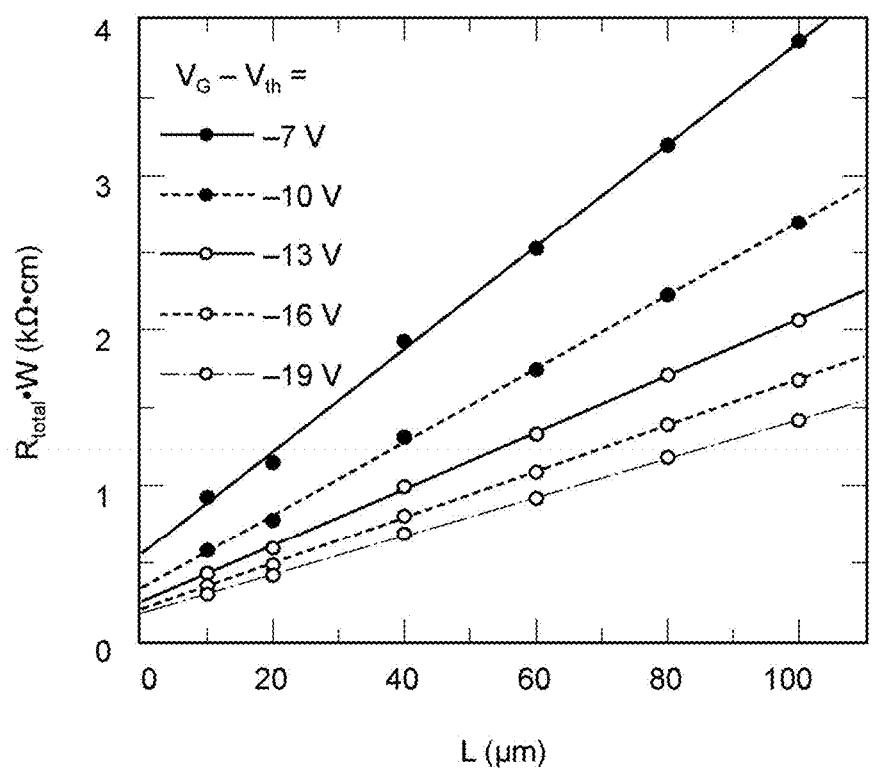
FIG. 44 is a graph showing a relationship between a channel length L and $R_{total} \cdot W$ for each of $V_G$-$V_{th}$.
Figure 45:
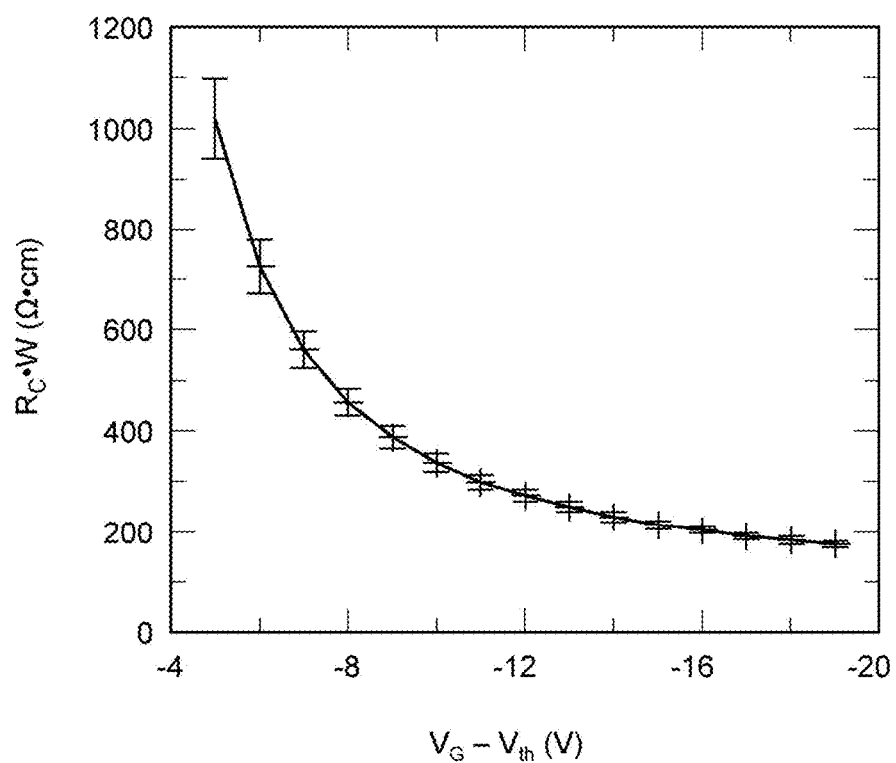
FIG. 45 is a graph showing a relationship between $V_G$-$V_{th}$ and $R_C \cdot W$.

The contact resistance of the fabricated organic semiconductor devices was evaluated using the Transmission Line Method (TLM) method. FIG. 44 shows a graph showing the relationship between the channel length L and the $R_{total} \cdot W$ for each of the $V_G$-$V_t$h. FIG. 45 shows a graph showing the relationship between the $V_G$-$V_t$h and the $R_C \cdot W$. From FIG. 45, it was confirmed that a low contact resistance of $R_C \cdot W$ of 175 Ω·cm or less was obtained.

Example 12

Figure 46:
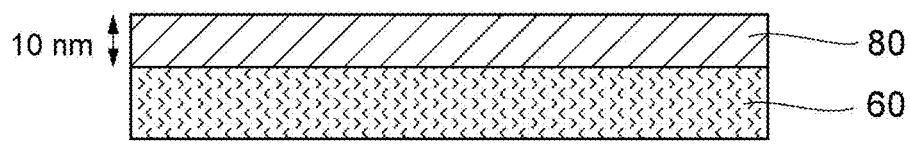
FIG. 46 is a schematic cross-sectional drawing of a substrate on which a liquid-repellent polymer layer is formed.

As a substrate, an Eagle glass (EAGLE XG (registered trademark) from Corning) substrate was prepared, and as shown schematically in FIG. 46, CYTOP (registered trademark) of CTL-809M having a thickness of 10 nm in which a terminal group is —CONH—Si(OR)n was formed as a liquid-repellent polymer layer 80 on the surface of the substrate 60.

The CTL-809M liquid-repellent polymer layer was formed by the following method. A solution prepared by CTL-809M:CT-Solv.180 (solvent for dilution)=1:30 (mass ratio) was spin-coated on a glass substrate. In the spin coating, the number of rotations was increased to 500 rpm in 1 second, held at 500 rpm for 10 seconds, and held at 1000 rpm for 40 seconds. The rotation was stopped, and the solvent was removed by drying at 50° C. for 1 minute, then at 80° C. for 15 minutes, and further at 130° C. for 40 minutes, thereby forming an 809M liquid-repellent polymer layer having a thickness of 10 nm.

Figure 47:
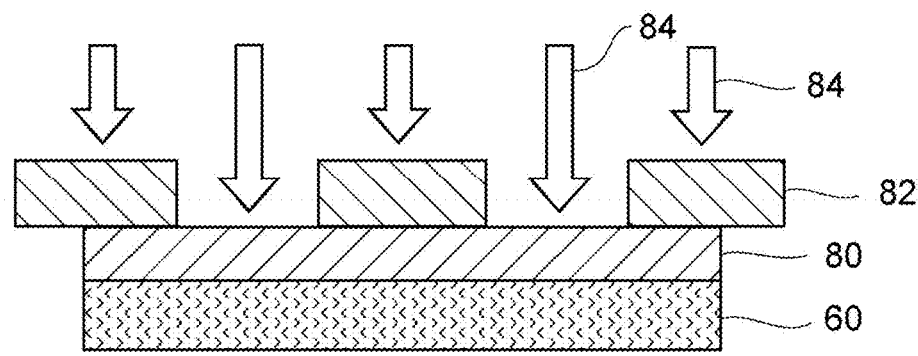
FIG. 47 is a schematic cross-sectional drawing showing an embodiment in which vacuum ultraviolet light is irradiated from the side where a photomask or a metal mask is disposed on a substrate on which a liquid-repellent polymer layer is formed.
Figure 48:
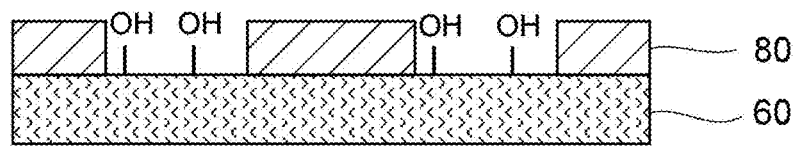
FIG. 48 is a schematic cross-sectional drawing of a substrate in which a hydroxyl group is formed at a position where a liquid-repellent polymer layer is decomposed.

As schematically shown in FIG. 47, a chromium photomask 82 was disposed on the glass substrate on which the liquid-repellent polymer layer 80 was formed, and vacuum ultraviolet light (VUV) 84 was irradiated from the side on which the photomask 82 was disposed. As schematically shown in FIG. 48, the liquid-repellent polymer layer 80 in the irradiated portion was decomposed, and a hydroxyl group was formed in the portion in which the liquid-repellent polymer layer was decomposed. The vacuum-ultraviolet light was irradiated in an $N_2$ flow-atmosphere using SUS1001 (manufactured by Ushio Electric Co., Ltd.) while moving an excimer lamp (wave length: 172 nm) at a rate of 0.04 mm/sec.

Figure 49:
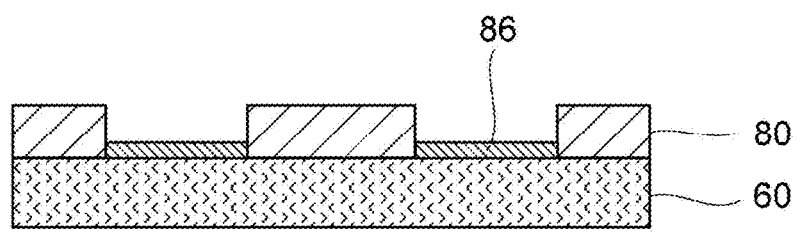
FIG. 49 is a schematic cross-sectional drawing of a surface of a substrate on which a self-assembled monolayer is formed at a position where a hydroxyl group is formed.

As schematically shown in FIG. 49, SAM treatment was performed on the surface of the glass substrate 60 on which the hydroxyl group was formed using the vapor phase method, and a fluorine-based self-assembled monolayer 86 of triethoxy-1H,1H,2H,2H-heptadecafluorodecylsilane (F-SAM) was formed on the surface. The fluorine-based self-assembled monolayer was formed by disposing the F-SAM solution and the glass substrate on which the hydroxyl group was formed in a sealed container, heating to 120° C. to form a saturated vapor atmosphere of the F-SAM molecules, standing the glass substrate on which the hydroxyl group was formed in the saturated vapor atmosphere of the F-SAM molecules for 3 hours, and washing the glass substrate with 2-propanol.

Next, an Ag ink (L-Ag1T, manufactured by ULVAC Corporation) having a solid content concentration of 30 wt % was diluted 50 times with octane to prepare an Ag ink containing Ag particles.

Figure 52:
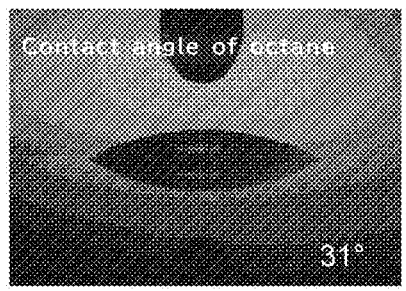
FIG. 52 is a photograph showing evaluation of the wettability of octane with respect to CYTOP (registered trademark) before irradiation with vacuum ultraviolet light.
Figure 53:
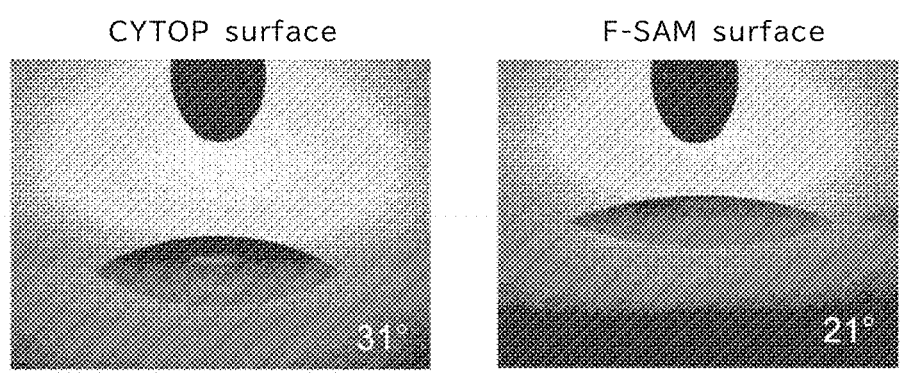
FIG. 53 is a photograph showing evaluation of the wettability of octane with respect to CYTOP (registered trademark) and F-SAM after a self-assembled monolayer is formed.

Here, the evaluation results of the contact angles between octane, which is a solvent of the Ag ink, and CYTOP (registered trademark) and F-SAM are shown. FIG. 52 shows a photograph obtained by evaluating the contact angle of octane with respect to CYTOP (registered trademark) before irradiation with vacuum ultraviolet light. FIG. 53 shows photographs obtained by evaluating the contact angles of octane with respect to CYTOP (registered trademark) after subjecting to vacuum ultraviolet light irradiation and SAM treatment, and with respect to F-SAM formed by vacuum ultraviolet light irradiation and SAM treatment. The contact angles were measured for CYTOP (registered trademark) (before vacuum ultraviolet light irradiation), CYTOP (registered trademark) (after vacuum ultraviolet light irradiation and SAM treatment), and F-SAM formed by vacuum ultraviolet light irradiation and SAM treatment.

CYTOP (registered trademark) had an octane contact angle of 31 degrees and F-SAM had an octane contact angle of 21 degrees both before the vacuum ultraviolet light irradiation and after the SAM treatment. Thus, before and after the SAM treatment, F-SAM was not formed on CYTOP (registered trademark), and it can be seen that F-SAM was selectively formed at a portion irradiated with vacuum ultraviolet light. It was also confirmed that CYTOP (registered trademark) was relatively lyophobic to octane, and F-SAM was relatively lyophilic to octane.

Figure 50:
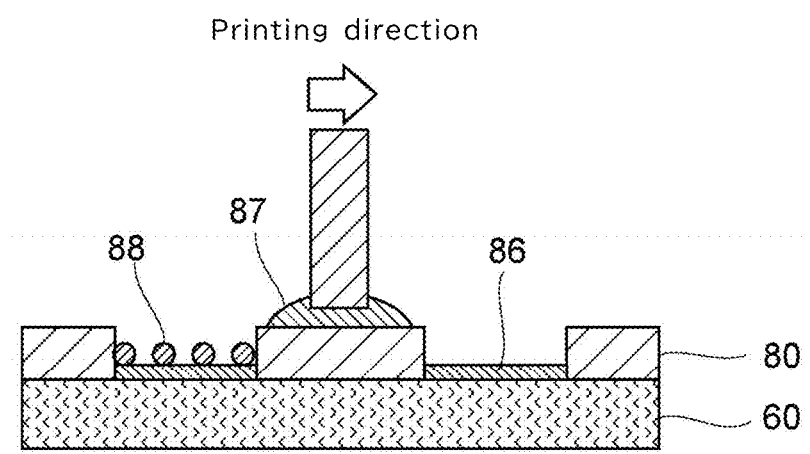
FIG. 50 is a schematic cross-sectional drawing showing an embodiment in which a conductive ink is applied onto a substrate on which a self-assembled monolayer is formed by a blade coating method to form patterned electrodes.
Figure 51:
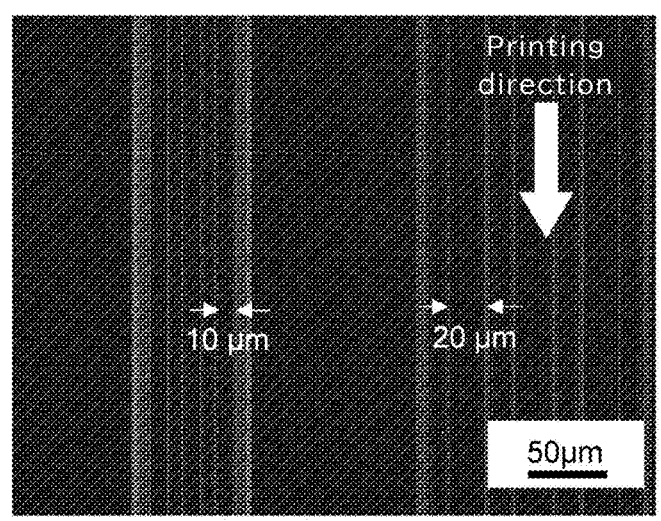
FIG. 51 is an external photograph of coating films composed of patterned Ag particles formed by a coating method.

As schematically shown in FIG. 50, the Ag ink containing octane as a main solvent, for which the contact angle was confirmed as described above, was applied on the glass substrate 60 on which the self-assembled monolayer 86 of F-SAM was formed by the blade coating method, and coating films composed of Ag particles 88 were formed so that the distance between the straight lines corresponding to the channel length was 10 μm and 20 μm. No coating film was formed on CYTOP (registered trademark), which was liquid-repellent, and the coating film was selectively formed only on F-SAM, which was lyophilic. FIG. 51 shows an external photograph of the coating films composed of the obtained patterned Ag particles. The Ag ink containing the Ag particles was prepared by diluting an Ag ink (L-Ag1T, manufactured by ULVAC CORPORATION) having a solid content concentration of 30 wt % by 50 times with octane.

Example 13

Figure 54:
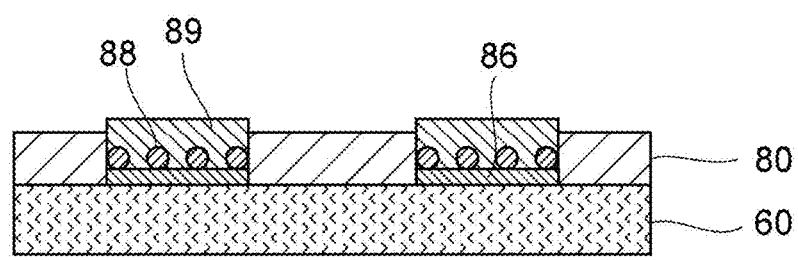
FIG. 54 is a schematic cross-sectional drawing of a substrate on which patterned electrodes with plating is formed.

Coating films composed of Ag particles were formed in the same manner as in Example 12 except that coating films composed of Ag particles were formed so that the channel length/channel width was 100 μm/1000 μm. As schematically shown in FIG. 54, electroless plating was performed using the Ag particles 88 as a catalyst on the glass substrate 60 on which the coating films composed of the Ag particles 88 were formed, thereby forming electrodes for source/drain with patterned Au plating 89.

As a plating solution for electroless plating, Pressure Fab ACG3000 (Nippon Electroplating Engineers Co., Ltd.) was used. The pH of the plating solution was adjusted to 7.5, the solution temperature was maintained at 65° C., and the glass substrate on which the conductive ink was applied was immersed in the plating solution for 150 seconds while the plating solution was stirred. The substrate was then heated at 150° C. for 10 minutes using a hot plate, and was immersed again for 150 seconds after cooling to room temperature to grow Au.

Figure 55:
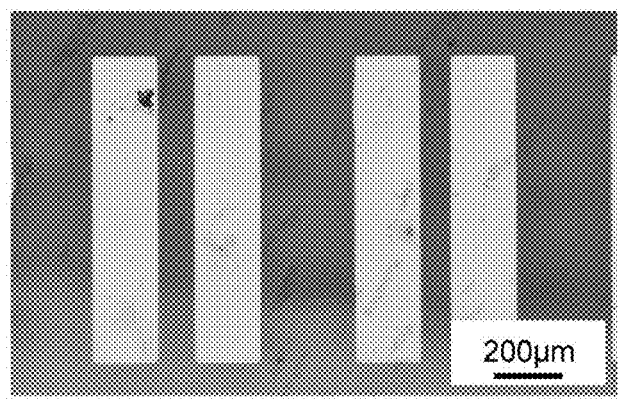
FIG. 55 is an external photograph of electrodes for source/drain with Au plating.

FIG. 55 shows an external photograph of the electrodes for source/drain with the obtained Au plating. The two sets of electrodes with Au plating had a channel length/channel width=100 μm/1000 μm and a surface roughness Rq of 0.5 nm. The surface roughness Rq is, as described below, the surface roughness of the electrode surface that was in contact with the self-assembled monolayer after forming the protective film and the handling film, attaching the Kapton tape to the handling film, and separating by pulling the Kapton tape.

Example 14

A protective film of parylene (diX-SR (registered trademark)) having a thickness of 1 μm was formed by a chemical vapor deposition method on the glass substrate, manufactured in Example 13, on which the electrodes with Au plating were formed.

On the protective film of parylene (registered trademark), a polyvinyl alcohol (PVA) aqueous solution of 5% by mass was applied, and dried at 50° C. for 2 hours to form a PVA handling film having a thickness of 10 μm.

The electrode film comprising the electrodes with Au plating, the parylene (registered trademark) protective film, and the PVA handling film was separated by sticking the Kapton tape to the handling film and pulling the Kapton tape.

In the same manner as in Example 6, a laminate of doped-Si, $SiO_2$, β-PTS, and an organic semiconductor film was prepared, and the electrode film was disposed on the organic semiconductor film so that the electrodes with Au-plating was in contact with the organic semiconductor film.

Figure 56:
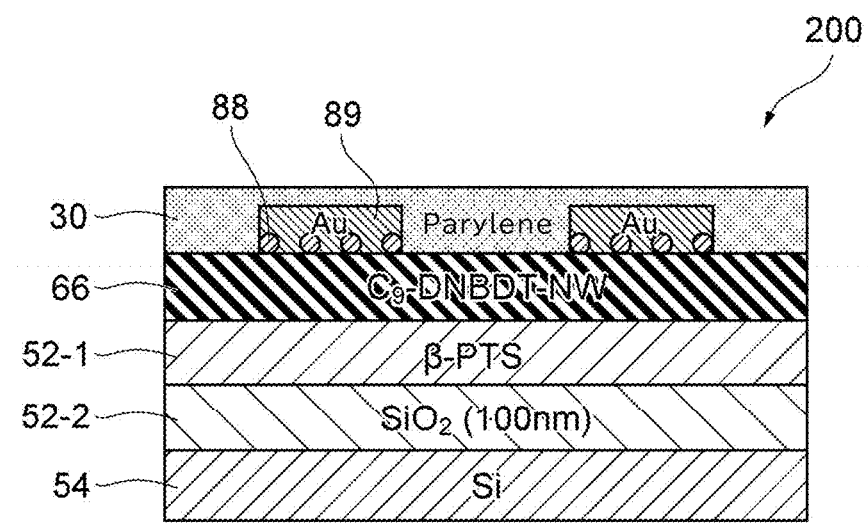
FIG. 56 is a schematic cross-sectional drawing of an organic field-effect transistor having a bottom gate/top contact structure.

Water was dropped on the handling film of PVA while heating to 80° C., and after the handling film was substantially peeled off, the temperature was lowered to 30° C., water was added until the entire electrode film was immersed, and the water in which the electrode film was immersed was stirred for 3 hours until the PVA was completely dissolved to remove the handling film, thereby fabricating an organic field-effect transistor having a bottom gate/top contact structure as schematically shown in FIG. 56.

Example 15

In the same manner as in Example 14, an electrode film comprising electrodes with Au plating, a parylene (registered trademark) protective film, and a PVA handling film was obtained.

Figure 57:
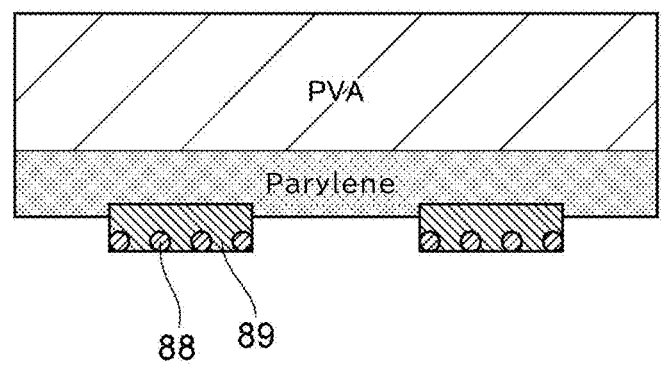
FIG. 57 is a schematic cross-sectional drawing of an electrode film comprising electrodes with Au plating, a parylene (registered trademark) protective film, and a PVA handling film.

The work function of one of the electrodes of the electrode film comprising the electrodes with Au plating, the parylene (registered trademark) protective film, and the PVA handling film schematically shown in FIG. 57 was measured by photoelectron yield spectroscopy (PYS). The work function was measured using PYS-202 (Sumitomo Heavy Industries, Ltd.) by the following formula:

$$Y^{1/2} \propto hv - W_F \qquad \text{[Formula 4]}$$

wherein Y is the photoelectron yield, h is the Planck constant, v is the frequency of the photons, and $W_F$ is the work function.

Figure 58:
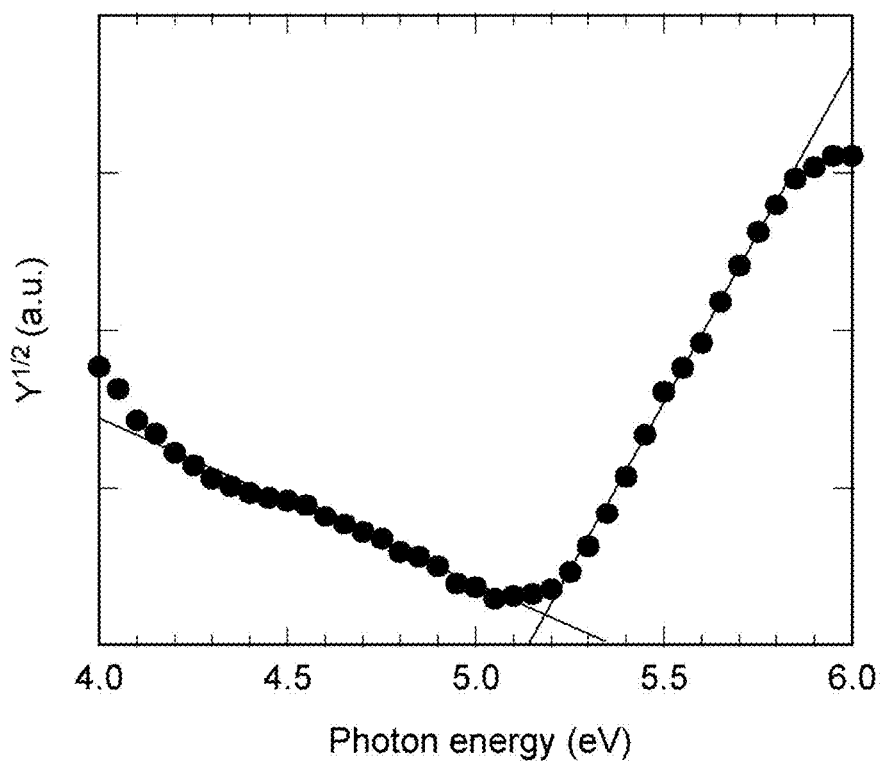
FIG. 58 is measured results of work functions obtained by plotting $Y^{1/2}$ against photon energy (hv).

FIG. 58 shows the measured results of the work functions obtained by plotting the $Y^{1/2}$ against the photon energy (hv). The $W_F$ of the electrodes obtained from the intersection of the two straight lines shown in FIG. 58 was 5.2 eV. The $W_F$ of gold is 5.2 eV, the $W_F$ of silver is 4.3 eV, and the HOMO level of $C_9$-DNBDT-NW is 5.24 eV. Therefore, in the obtained electrodes, gold deposited by electroless plating was dominant in the work function, and it is found that a high work function advantageous for carrier injection into the organic semiconductor film was obtained.

Example 16

An electrode film comprising electrodes with Au plating, a parylene (registered trademark) protective film, and a PVA handling film was obtained in the same manner as in Example 12 except that a total of 32 sets of 4 sets each of electrodes with Au plating were formed each having a channel length/channel width of 40 μm/315 μm, 60 μm/315 μm, 80 μm/315 μm, 100 μm/315 μm, 120 μm/315 μm, 140 μm/315 μm, 160 μm/315 μm, and 180 μm/315 μm.

In the same manner as in Example 6, a laminate of doped-Si, $SiO_2$, β-PTS, and an organic semiconductor film was prepared, and the electrode film was disposed on the organic semiconductor film so that the electrodes with Au-plating were in contact with the organic semiconductor film.

Water was dropped on the handling film of PVA while heating to 80° C., and after the handling film was substantially peeled off, the temperature was lowered to 30° C., water was added until the entire electrode film was immersed, and the water in which the electrode film was immersed was stirred for 3 hours until the PVA was completely dissolved to remove the handling film, thereby fabricating an organic field-effect transistor having a bottom gate/top contact structure as schematically shown in FIG. 56.

Figure 59:
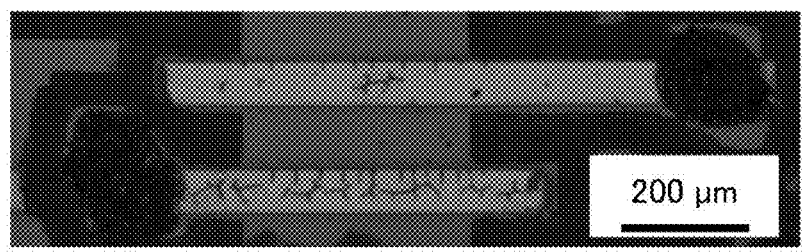
FIG. 59 is an external photograph of source/drain electrodes having a channel length/channel width of 100 μm/315 μm.
Figure 60:
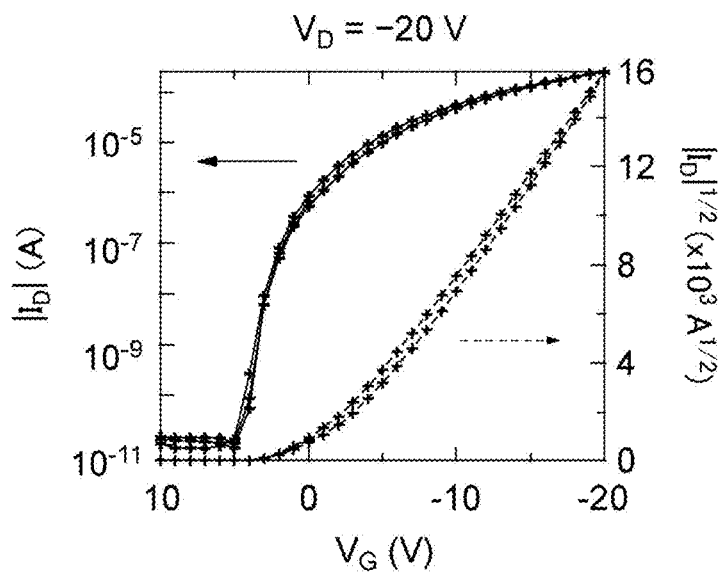
FIG. 60 is a graph of transfer characteristics representing a relationship between a gate voltage and a drain current in a saturation region.
Figure 61:
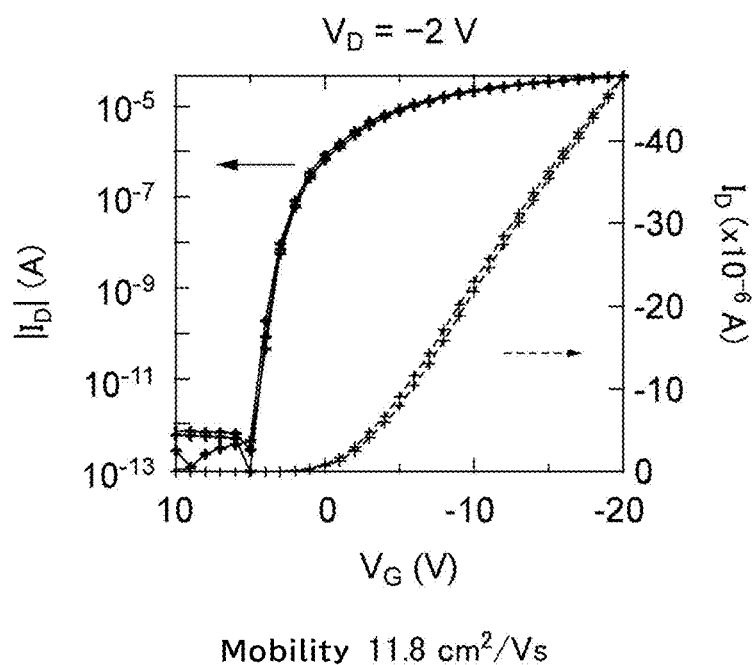
FIG. 61 is a graph of transfer characteristics representing a relationship between a gate voltage and a drain current in a linear region.
Figure 62:
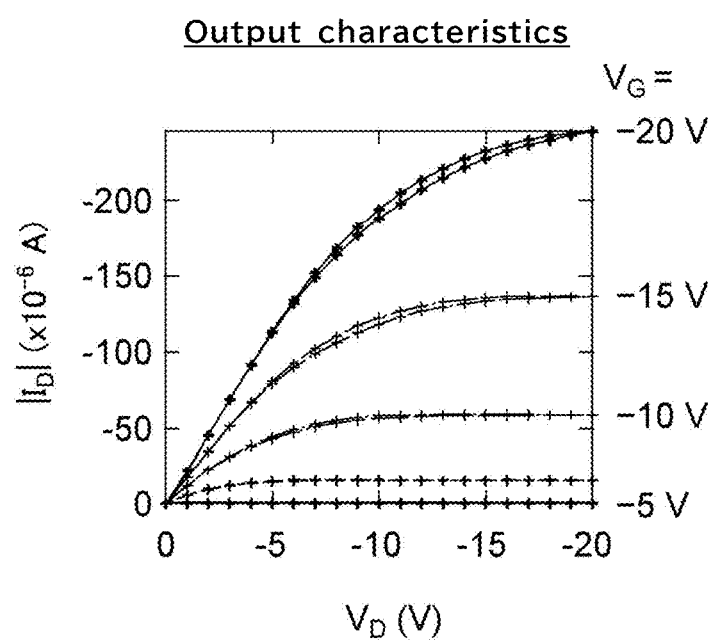
FIG. 62 is a graph of output characteristics representing a relationship between a drain voltage and a drain current depending on a gate voltage.

With respect to a transistor having the source/drain electrodes having the channel length/channel width of 100 μm/315 μm shown in FIG. 59 among the transistors manufactured with different channel lengths/channel widths, FIG. 60 shows a graph of the transfer characteristics representing the relationship between the gate voltage and the drain current in the saturation region, FIG. 61 shows a graph of the transfer characteristics representing the relationship between the gate voltage and the drain current in the linear region, and FIG. 62 shows a graph of the output characteristics representing the relationship between the drain voltage and the drain current depending on the gate voltage. The mobility in the saturated region was 12.7 $cm^2$/Vs, and the mobility in the linear region was 11.8 $cm^2$/V·s, which were very large mobility. In calculating the mobility, theoretical values were used for the capacitance of the insulating film in which $SiO_2$ and β-PTS were laminated.

Example 17

Figure 63:
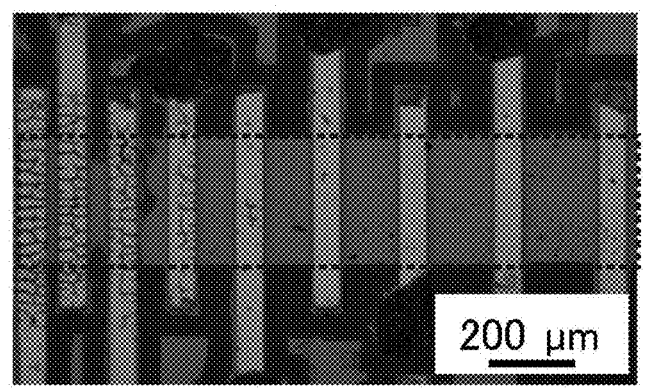
FIG. 63 is an external photograph in which a range in which the contact resistance is evaluated is indicated by a broken line.

The contact resistance of the organic field-effect transistor of the bottom gate/top contact structure as schematically shown in FIG. 56 having electrodes with Au plating was evaluated, wherein the channel length/channel width fabricated in Example 16 was 40 μm/315 μm, 60 μm/315 μm, 80 μm/315 μm, 100 μm/315 μm, 120 μm/315 μm, 140 μm/315 μm, 160 μm/315 μm, and 180 μm/315 μm. In FIG. 63, a range in which the contact resistance was evaluated is indicated by a broken line.

Figure 64:
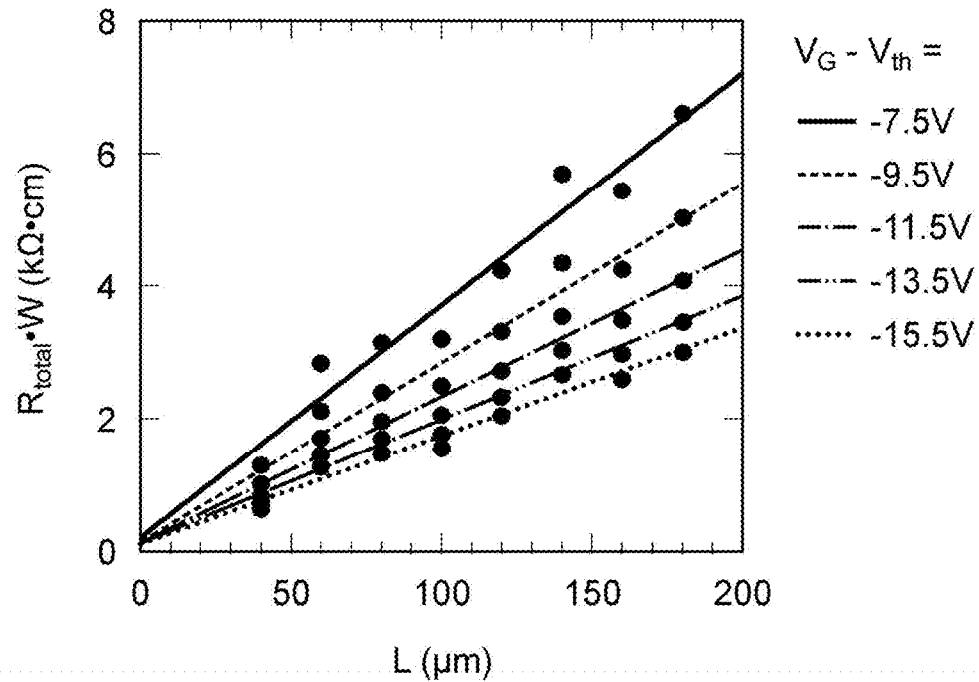
FIG. 64 is a graph showing a relationship between a channel length L and $R_{total} \cdot W$ for each of $V_G\text{-}V_{th}$.
Figure 65:
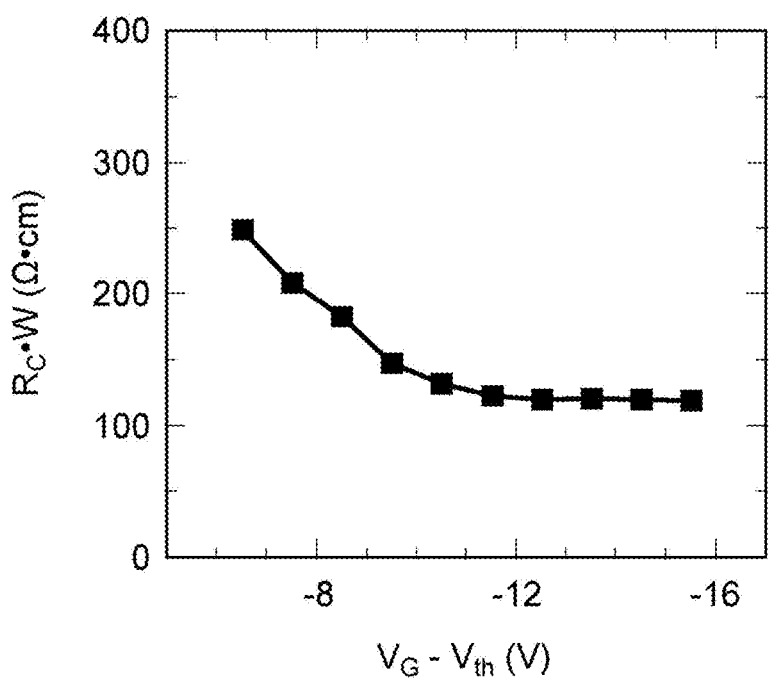
FIG. 65 is a graph showing a relationship between $V_G\text{-}V_{th}$ and $R_C \cdot W$.

The contact resistance was evaluated using the Transmission Line Method (TLM) method. FIG. 64 shows a graph showing the relationship between the channel length L and the $R_{total}$·W for each of the $V_G$-$V_t$h, and FIG. 65 shows a graph showing the relationship between the $V_G$-$V_t$h and the $R_C$·W. It was confirmed that the $R_C$·W was 120 Ω·cm indicating low contact resistance.

Example 18

Figure 66:
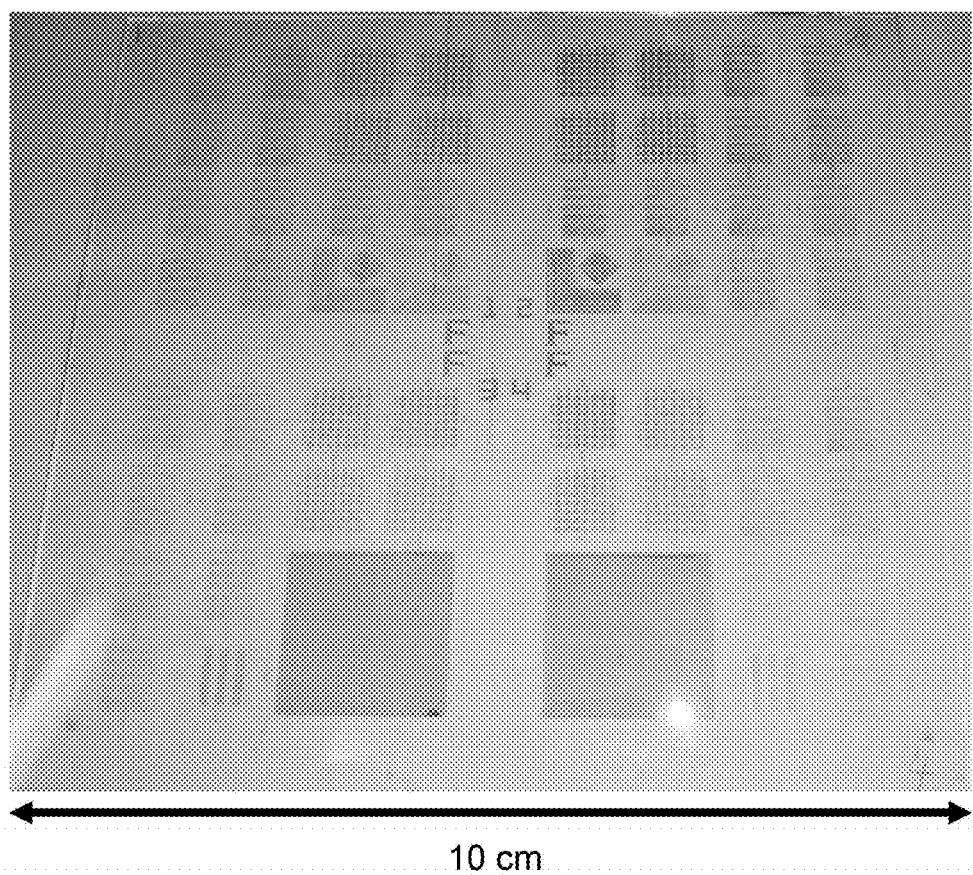
FIG. 66 is an external photograph of a coating film composed of patterned Ag particles formed by a coating method.

An Ag ink containing Ag particles was applied by a blade coating method on a glass substrate on which a self-assembled monolayer of F-SAM was formed in the same manner as in Example 12 except that a coating film composed of Ag particles having a plurality of combinations of channel length/channel width was formed in the range of 10 cm square, thereby forming a coating film composed of patterned Ag particles. FIG. 66 shows an external photograph of the coating film composed of the patterned Ag particles formed in the area of 10 cm square. The channel lengths/channel widths of the coating film composed of the Ag particles shown in FIG. 66 included 784 sets of 100 μm/800 μm, 1870 sets of 170 sets each of 10 μm/200 μm, 20 μm/200 μm, 40 μm/200 μm, 60 μm/200 μm, 80 μm/200 μm, 100 μm/200 μm, 120 μm/200 μm, 140 μm/200 μm, 160 μm/200 μm, 180 μm/200 μm, and 200 μm/200 μm, and 374 sets of 34 sets each of 10 μm/300 μm, 20 μm/300 μm, 40 μm/300 μm, 60 μm/300 μm, 80 μm/300 μm, 100 μm/300 μm, 120 μm/300 μm, 140 μm/300 μm, 160 μm/300 μm, 180 μm/300 μm, and 200 μm/300 μm, and 6 sets of 2 sets each of 100 μm/6000 μm, 170 μm/6000 μm, and 200 μm/6000 μm.

The parallelism of the channel length of the coating film composed of the Ag particles before plating corresponding to each electrode set (one element) was 0.1 degrees or less.

Comparative Example 1

As an elastomer, a polydimethylsiloxane (PDMS) film having a thickness of 10 μm and a tack property and a glass transition point of −123° C. was prepared, Au electrodes and a carrier injection promoting layer of $F_4$-TCNQ were deposited on the PDMS film through a metal mask, and a set of Au electrodes having a thickness of 40 nm and a channel length/channel width=400 μm/200 μm were formed.

In the same manner as in Example 6, an organic semiconductor device was manufactured by preparing a laminate of doped-Si, $SiO_2$, β-PTS, and an organic semiconductor film, and disposing the Au electrodes, the carrier injection promoting layer of $F_4$-TCNQ, and PDMS on the organic semiconductor film so that the Au electrodes were in contact with the organic semiconductor film.

The changes with time in mobility in the linear region of the organic semiconductor device manufactured in Example 6 and Comparative Example 1 are shown in Table 1. The mobility of the transistor of the organic semiconductor device manufactured in Example 6 did not substantially change even after 4 weeks and 8 weeks.

TABLE 1

| | At the time of production | After passage of time |
|---|---|---|
| Example 6 | 11.6 cm$^2$/V · s | 11.5 cm$^2$/V · s (after 4 weeks)<br>11.5 cm$^2$/V · s (after 8 weeks) |
| Comparative Example 1 | 9.6 cm$^2$/V · s | It did not work as a transistor (after 8 weeks) |

REFERENCE SIGNS LIST 100 organic semiconductor device
200 organic semiconductor device
600 electrode film
10 electrode
101 surface of electrode 10
12 second electrode of FIG. 1
14 third electrode of FIG. 1
20 electrode
201 surface of electrode 20
22 second electrode of FIG. 1
24 third electrode of FIG. 1
30 protective film
40 channel
52 gate insulating film
52-1 gate insulating film
52-2 gate insulating film
54 gate electrode
56 underlayer
60 substrate
62 release layer
64 handling film
66 organic semiconductor film
70 underlayer
72 underlayer
74 gate electrode
80 liquid-repellent polymer layer
82 photomask or metal mask
84 UV light
86 self-assembled monolayer
87 conductive ink
88 metal particles
89 plating

The invention claimed is:

1. Electrodes for source/drain of an organic semiconductor device, comprising 10 or more sets of electrodes,
   wherein a channel length between the electrodes in each set is 200 μm or less,
   the electrodes in each set have a surface with a surface roughness Rq of 2 nm or less, and
   the parallelism of the channel length between the electrodes in the each set is 1 degree or less.

2. The electrodes for source/drain according to claim 1, further comprising a protective film, wherein the protective film is composed of an insulating polymer having a thickness of 1 μm or less and a glass transition point of 80° C. or more, attached to surfaces opposite to the surfaces of the electrodes in the each set by electrostatic force, and extending in at least a part of the channel in the each set.

3. The electrodes for source/drain according to claim 1, wherein the electrodes comprise plating.

4. An organic semiconductor device comprising: a gate electrode, a gate insulating film, an organic semiconductor film, and the electrodes for source/drain according to claim 1.

5. Electrodes for source/drain of an organic semiconductor device, comprising 10 or more sets of electrodes,
   wherein a channel length between the electrodes in each set is 200 μm or less, and the electrodes in each set have a surface with a surface roughness Rq of 2 nm or less, and further comprising a protective film, wherein the protective film is composed of an insulating polymer having a thickness of 1 μm or less and a glass transition point of 80° C. or more, attached to surfaces opposite to the surfaces of the electrodes in the each set by electrostatic force, and extending in at least a part of the channel in the each set.

6. The electrodes for source/drain according to claim 5, wherein the electrodes comprise plating.

7. An organic semiconductor device comprising: a gate electrode, a gate insulating film, an organic semiconductor film, and the electrodes for source/drain according to claim 5.

8. An organic semiconductor device comprising: a gate electrode, a gate insulating film, an organic semiconductor film, and electrodes for source/drain comprising 10 or more sets of electrodes,
- wherein a channel length between the electrodes in each set is 200 µm or less,
- the electrodes in each set have a surface with a surface roughness Rq of 2 nm or less, and
- a surface roughness Rq of a surface of the organic semiconductor film in contact with the electrodes in each set is equal to or less than 2 nm.

9. A method for manufacturing electrodes for source/drain of an organic semiconductor device, the method comprising:
- preparing a substrate having a surface with a surface roughness Rq of 2 nm or less,
- forming a release layer on the surface of the substrate,
- forming 10 or more sets of electrodes for source/drain having a channel length of 200 µm or less on the release layer,
- forming a protective film on the release layer and the electrodes,
- forming a handling film on the protective film,
- separating an interface between the release layer and each of the electrodes and the protective film to obtain an electrode film comprising the electrodes, the protective film, and the handling film, and
- removing the handling film.

10. The method for manufacturing electrodes for source/drain of an organic semiconductor device according to claim 9, wherein the forming the release layer comprises:
- subjecting the surface of the substrate to UV ozone treatment to form a hydroxyl group on the surface of the substrate,
- subjecting the surface of the substrate on which the hydroxyl group has been formed to SAM treatment.

11. The method for manufacturing electrodes for source/drain of an organic semiconductor device according to claim 9, wherein the forming the release layer comprises:
- forming a liquid-repellent polymer layer on the surface of the substrate,
- disposing a photomask or a metal mask on the substrate on which the liquid-repellent polymer layer has been formed,
- performing UV irradiation on the substrate from the side on which the photomask or the metal mask has been disposed to decompose the liquid-repellent polymer layer at the irradiated portion and form a hydroxyl group at the decomposed portion of the liquid-repellent polymer layer, and
- performing SAM treatment on the portion where the hydroxyl group has been formed, and wherein the forming 10 or more sets of electrodes for source/drain having a channel length of 200 µm or less comprises:
- applying a conductive ink containing metal particles on the release layer; and
- performing electroless plating using the metal particles as a catalyst on the substrate on which the release layer coated with the conductive ink has been formed to form 10 or more sets of electrodes for source/drain provided with plating having the channel length of 200 µm or less.

12. A method for manufacturing an organic semiconductor device, comprising:
- preparing a substrate having a surface roughness Rq of 2 nm or less,
- forming a release layer on the surface of the substrate,
- forming 10 or more sets of electrodes for source/drain having a channel length of 200 µm or less on the release layer,
- forming a protective film on the release layer and the electrodes,
- forming a handling film on the protective film,
- separating an interface between the release layer and the electrodes and the protective film to obtain an electrode film comprising the electrodes, the protective film, and the handling film,
- disposing the electrode film on the organic semiconductor film, and
- removing the handling film.

13. The method for manufacturing an organic semiconductor device according to claim 12, wherein the forming the release layer comprises:
- subjecting the surface of the substrate to UV ozone treatment to form a hydroxyl group on the surface of the substrate, and
- performing SAM treatment on the surface of the substrate on which the hydroxyl group has been formed.

14. The method for manufacturing an organic semiconductor device according to claim 12, wherein the forming the release layer comprises:
- forming a liquid-repellent polymer layer on the surface of the substrate,
- disposing a photomask or a metal mask on the substrate on which the liquid-repellent polymer layer has been formed,
- performing UV irradiation on the substrate from the side on which the photomask or the metal mask has been disposed to decompose the liquid-repellent polymer layer at the irradiated portion and form a hydroxyl group at the decomposed portion of the liquid-repellent polymer layer, and
- performing SAM treatment on the portion where the hydroxyl group has been formed, and wherein the forming 10 or more sets of electrodes for source/drain having a channel length of 200 µm or less comprises:
- applying a conductive ink containing metal particles on the release layer; and
- performing electroless plating on the substrate on which the release layer coated with the conductive ink has been formed using the metal particles as a catalyst to form 10 or more sets of electrodes for source/drain provided with plating having the channel length of 200 µm or less.

\* \* \* \* \*